United States Patent
Conradi et al.

(10) Patent No.: US 9,442,381 B2
(45) Date of Patent: Sep. 13, 2016

(54) METHOD OF OPERATING A PROJECTION EXPOSURE TOOL FOR MICROLITHOGRAPHY

(71) Applicant: Carl Zeiss SMT GmbH, Oberkochen (DE)

(72) Inventors: Olaf Conradi, Westhausen/Westerhofen (DE); Michael Totzeck, Schwaebisch Gmuend (DE); Ulrich Loering, Schwaebisch Gmuend (DE); Dirk Juergens, Lauchheim (DE); Ralf Mueller, Aalen (DE); Christian Wald, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 398 days.

(21) Appl. No.: 13/939,859

(22) Filed: Jul. 11, 2013

(65) Prior Publication Data
US 2013/0301024 A1 Nov. 14, 2013

Related U.S. Application Data

(63) Continuation of application No. PCT/EP2011/000225, filed on Jan. 20, 2011.

(51) Int. Cl.
*G03B 27/54* (2006.01)
*G03B 27/68* (2006.01)
(Continued)

(52) U.S. Cl.
CPC ............ *G03F 7/70141* (2013.01); *G03F 7/708* (2013.01); *G03F 7/70483* (2013.01); *G03F 7/70891* (2013.01)

(58) Field of Classification Search
CPC ........ G03F 7/70141; G03F 7/70091–7/70116; G03F 7/70258; G03F 7/70283; G03F 7/70483; G03F 7/70533; G03F 7/7055; G03F 7/70558; G03F 7/706; G03F 7/70883; G03F 7/70891

USPC ............ 355/30, 52, 53, 55, 67–71, 77; 250/492.1, 492.2, 492.22, 493.1, 548; 430/5, 8, 22, 30, 311, 312
See application file for complete search history.

(56) References Cited

U.S. PATENT DOCUMENTS 5,581,324 A * 12/1996 Miyai et al. .................... 355/53
6,673,638 B1 1/2004 Bendik et al.
(Continued)

FOREIGN PATENT DOCUMENTS

DE 10 2006 027 787 1/2007
DE 10 2008 006 687 7/2008
(Continued)

OTHER PUBLICATIONS

Optical Shop Testing, second edition (1992) published by John Wiley & Sons, Inc., edited by Daniel Malacara, Chapters 13.2.2-13.2.3.
(Continued)

*Primary Examiner* — Christina Riddle
(74) *Attorney, Agent, or Firm* — Fish & Richardson P.C.

(57) ABSTRACT

A method of operating a projection exposure tool for microlithography is provided. The projection exposure tool has a projection objective for imaging object structures on a mask into an image plane using electromagnetic radiation, during which imaging the electromagnetic radiation causes a change in optical properties of the projection objective. The method comprises the steps of: providing the layout of the object structures on the mask to be imaged and classifying the object structures according to their type of structure, calculating the change in the optical properties of the projection objective effected during the imaging process on the basis of the classification of the object structures, and using the projection exposure tool for imaging the object structures into the image plane, wherein the imaging behavior of the projection exposure tool is adjusted on the basis of the calculated change of the optical properties in order to at least partly compensate for the change of the optical properties of the projection objective caused by the electromagnetic radiation during the imaging process.

36 Claims, 6 Drawing Sheets

(51) Int. Cl.
*G03B 27/52* (2006.01)
*G03F 7/20* (2006.01)

(56) References Cited

U.S. PATENT DOCUMENTS

| | | | |
|---|---|---|---|
| 2002/0085286 A1 | 7/2002 | Drodofsky et al. | |
| 2004/0059444 A1 | 3/2004 | Tsukakoshi | |
| 2004/0144915 A1 | 7/2004 | Wagner et al. | |
| 2005/0254024 A1* | 11/2005 | Marie Van Greevenbroek | G03F 7/70891 355/30 |
| 2006/0008716 A1* | 1/2006 | Jeunink et al. | 430/30 |
| 2006/0077371 A1* | 4/2006 | Wegmann et al. | 355/67 |
| 2006/0114437 A1 | 6/2006 | Akhssay et al. | |
| 2007/0263190 A1 | 11/2007 | De Boeij et al. | |
| 2008/0002167 A1 | 1/2008 | Gruner et al. | |
| 2008/0192217 A1* | 8/2008 | Laan | G03F 7/70891 355/53 |
| 2008/0220345 A1 | 9/2008 | Van De Kerkhof et al. | |
| 2008/0239503 A1 | 10/2008 | Conradi et al. | |
| 2009/0153831 A1 | 6/2009 | Conradi et al. | |
| 2009/0225293 A1* | 9/2009 | Shigenobu | G03B 27/32 355/53 |
| 2009/0231565 A1 | 9/2009 | Conradi | |
| 2009/0296055 A1 | 12/2009 | Ye et al. | |
| 2010/0201958 A1* | 8/2010 | Hauf | G02B 7/008 355/30 |

FOREIGN PATENT DOCUMENTS

| | | |
|---|---|---|
| EP | 1 670 041 | 6/2006 |
| EP | 1 881 373 | 1/2008 |
| JP | 2002-175980 A | 6/2002 |
| JP | 2004-221253 A | 8/2004 |
| JP | 2006-019561 A | 1/2006 |
| JP | 2006-157020 A | 6/2006 |
| JP | 2007-194551 A | 8/2007 |
| JP | 2007-311782 | 11/2007 |
| JP | 2009-503826 A | 1/2009 |
| JP | 2010-502027 A | 1/2010 |
| JP | 2010-511298 A | 4/2010 |
| JP | 2011-522441 A | 7/2011 |
| WO | WO 02/054036 | 7/2002 |
| WO | WO 2008/064859 A2 | 6/2008 |

OTHER PUBLICATIONS

Handbook of Optical Systems: vol. 2 Physical Image Formation, edited by H. Gross, 2005 Wiley-VCH Verlag GmbH & Co. KGaA, Weinheim, p. 215.

Japanese Office Action, with translation thereof, for JP Appl No. 2013-549717, dated Jul. 24, 2014.

International Search Report for corresponding Appl. No. PCT/EP2011/000225, dated Dec. 30, 2011.

Japanese Office Action with English translation thereof for corresponding JP Appln. No. 2013-549717, 6 pages, dated Jul. 6, 2015.

* cited by examiner

METHOD OF OPERATING A PROJECTION EXPOSURE TOOL FOR MICROLITHOGRAPHY

BACKGROUND OF THE INVENTION

The invention relates to a method of operating a projection exposure tool for microlithography, a control apparatus for operating such a projection exposure tool and a projection exposure tool including such a control apparatus.

For an economical operation of a projection exposure tool, the shortest possible exposure time is desirable, so as to achieve a high throughput rate of substrates being exposed. Therefore high radiation intensities are required for an adequate exposure of the substrates. In particular, when using radiation in the ultraviolet or extreme ultraviolet (EUV) wavelength region, the influence of intensive radiation can result in radiation-induced changes in the properties of the optical elements of the projection exposure apparatus, and the magnitude of these changes increase with the radiation dose. For example, absorbed radiation in a lens can have the effect of a localized temperature change in the lens, which may result in a localized change of refractive index and surface of the lens. This effect is a reversible, short-term effect and known as "lens heating". Further, radiation can result in irreversible, long-term effects in the lens known as "life-time effects". Such effects include compaction (increased density) or rarefaction (reduced density) of the lens. When using 193 nm radiation a particularly large radiation-induced density increase is observed in quartz glass (fused silica).

According to a known method a so called "full chip" simulation is performed based on the layout of the whole mask to be imaged onto a wafer using the so-called fininte element method (FEM) to calculate the temperature distribution within the lens. This rigorous approach requires large computing resources and is too time-consuming to correct short term radiation-induced effects on the lithographic image based on this method.

SUMMARY OF THE INVENTION

It is one object of the invention to solve the above problems and in particularcontain the effects of the radiation-induced changes, especially the short-term effects, on the lithographic image within a narrow range.

According to a first aspect of the invention a method of operating a projection exposure tool for microlithography having a projection objective for imaging object structures on a mask into an image plane using electromagnetic radiation is provided. During the imaging the electromagnetic radiation causes a change in optical properties of the projection objective. The method according to the first aspect of the invention comprises the steps of: providing the layout of the object structures on the mask to be imaged and classifying the object structures according to their type of structure, calculating the change in the optical properties of the projection objective effected during the imaging process on the basis of the classification of the object structures, and using the projection exposure tool for imaging the object structures into the image plane, wherein the imaging behavior of the projection exposure tool is adjusted on the basis of the calculated change of the optical properties in order to at least partly compensate for the change of the optical properties of the projection objective caused by the electromagnetic radiation during the imaging process.

Further according to the first aspect of the invention a control apparatus is provided, which control apparatus is for operating a projection exposure tool for microlithography having a projection objective for imaging object structures on a mask into an image plane using electromagnetic radiation, during which imaging the electromagnetic radiation causes a change in optical properties of the projection objective. The control apparatus comprises an input device for receiving the layout of the object structures on the mask to be imaged and a processing device configured to classify the object structures according to their type of structure and to calculate the change in the optical properties of the projection objective effected during the imaging process on the basis of the classification of the object structures. Further the control apparatus comprises an adjustment device configured to adjust the imaging behavior of the projection exposure tool on the basis of the calculated change of the optical properties in order to at least partly compensate for the change of the optical properties of the projection objective caused by the electromagnetic radiation during the imaging process. According to the invention further a projection exposure tool is provided comprising the above control apparatus.

The method and the control apparatus according to the invention is particularly effective if the change in the optical properties of the projection objective is caused by the above described lens heating effect causing a localized change in refractive index and surface of single optical elements of the projection objective. As mentioned above, the change in the optical properties can also be caused by life-time effects. The layout of the object structures on the mask can e.g. be obtained directly from the design data of the respective mask layout.

By classifying the object structures on the mask according to their type of structure it is possible to calculate the change in the optical properties of the projection objective effected by the radiation on the basis of this classification. Compared to the above mentioned rigorous calculation of the change this calculation is less accurate and may therefore also be referred to as approximation. The calculation according to the invention can be done by calculating an angular distribution of radiation entering the projection objective for each of the classified types of structure and combining the results. Compared to the rigorous, more sophisticated approach, in which the layout of the whole mask area is used for performing a so called "full chip" simulation also resulting in an angular distribution of the radiation entering the projection objective, the inventive solution requires significantly less computing resources. Therefore, an angular distribution for a new mask to be exposed can be calculated in a time span short enough for not interrupting the operation of the projection exposure tool in production significantly using reasonable computing resources.

The calculation of the change in optical properties according to the inventive solution allows a compensation of the imaging behavior of the projection exposure tool customized to the individual mask used for exposure. Therefore, the compensation can be performed with a high precision and aberrations in the lithographic image caused by lens heating effects can be contained within a narrow range.

According to an embodiment of the invention the mask is illuminated during the imaging process with the electromagnetic radiation in a specific illumination mode, defining the angular distribution of the radiation illuminating the mask, and the calculation of the change in the optical properties is performed further on the basis of the illumination mode. The illumination mode is often also referred to as illumination setting selected for exposing a given mask. According to this embodiment therefore the change in the optical properties of the projection objective effected during the imaging process is calculated on the basis of the illumination mode and the classification of the object structures. According to this embodiment the processing device is configured to calculate for a given illumination mode the change in the optical properties of the projection objective effected during the imaging process on the basis of the classification of the object structures.

According to a further embodiment of the invention the thermal eigenmodes of at least one single optical element of the projection objective are provided together with the projection objective and the calculation of the change in the optical properties is performed on the basis of the thermal eigenmodes. For example the thermal eigenmodes are determined before delivery to the customer and then provided together with the associated projection objective to the customer. On the customer's site the provided thermal eigenmodes may be used to calculate the change in the optical properties as explained in more detail later.

According to an embodiment of the invention the calculation of the change of the optical properties of the projection objective includes a calculation of an angular distribution of the electromagnetic radiation entering the projection objective for each of the classified types of structure. The angular distribution of radiation entering the projection objective corresponds to a diffraction angle distribution of the radiation diffracted at the object structures. The calculation of this distribution may include the step of calculating a convolution of the Fourier transform of the layout of mask structures with the illumination distribution.

According to a further embodiment of the invention the mask is illuminated during the imaging process with the electromagnetic radiation in one of several illumination modes and the angular distribution of the electromagnetic radiation entering the projection objective is calculated for each of the classified types of structure taking into account the illumination mode used during the imaging process. The illumination mode defines the angular distribution of the radiation rays irradiating the mask and is also referred to as illumination setting.

In one variation the history of a number of subsequent operating phases of the projection exposure tool using various illumination modes and/or various masks are included into the adjustment of the imaging behavior of the projection exposure tool using weighted quadratic averaging depending of the duration of the operating phases. Therewith irreversible damages to the optical elements previously referred to as "life-time effects", e.g. compaction in a lens, occurred in a prior imaging phase is taken into account for determining the optical properties of the projection objective.

According to a further embodiment of the invention the classification of the object structures includes a determination of the sizes of the respective areas covered by the different types of structures on the mask. According to a further variation the calculation of the change of the optical properties of the projection objective includes a determination of an approximated overall angular distribution of the electromagnetic radiation entering the projection objective, which overall angular distribution is calculated from a weighted sum of the angular distributions for the single classified types of structures, which angular distributions are respectively weighted by the determined sizes of the mask areas covered by the respective types of structures. As described in more detail later, the calculation of the change of the optical properties of the projection objective can be performed by calculating a heat distribution on the single lenses of the projection objective from the approximated overall angular distribution of the electromagnetic radiation entering the projection objective, and determining changes in the optical properties of the respective lenses from lens heating effects introduced by the heat distributions.

According to a further embodiment of the invention the classification of the object structures contains a portioning of the mask into at least two types of regions, wherein a first type of region contains densely arranged object structures with respect to a second type of region, which contains sparsely arranged object structures with respect to the arrangement density of the first type of region. A region of densely arranged object structures can e.g. be a cell area of a chip design. A peripheral area of a chip design can be considered a region of sparsely arranged object structures. According to a variation, in the calculation of the change in the optical properties of the projection objective the region of the second type is approximated by a region containing no object structures. In this case the incoming radiation can be calculated using $0^{th}$ diffraction order of illumination radiation for the portion of the mask associated with the region of the second type.

In a further embodiment according to the invention the calculated change in optical properties of the projection objective during the imaging process is due to lens heating of at least one single lens element of the projection objective caused by the electromagnetic radiation irradiating the respective lens.

According to a further embodiment of the invention a deviation of the wave front in the image plane due to the change in the optical properties is calculated and the imaging behavior of the projection exposure tool is adjusted in order to compensate for the calculated wave front deviation. According to one variation the imaging behavior of the projection exposure tool is adjusted by manipulating the position or shape of at least one optical element, in particular an optical element of the projection objective, using an actuator. For this purpose e.g. the position of one or more optical elements can be changed by a translation or a rotation movement. An adjustment of the imaging behavior can also include a modification of the shape of an optical element or an exchange of an optical element. Further to adjusting the imaging behavior of the projection objective the imaging behavior of the projection exposure tool can also be adjusted by changing the angular distribution of the illumination of the mask accordingly.

According to a further embodiment of the invention the adjustment of the imaging behavior is performed by optimizing the coefficients of the Zernike polynomials of the wave front deviation of the lithographic image, at least one of the coefficients of the Zernike polynomials being weighted differently in the target function of the optimization problem as compared to other coefficients. This way the importance of the Zernike coefficients to the specific object structures can be weighed into the optimization.

According to a further embodiment of the invention the adjustment of the imaging behavior is performed by optimizing the coefficients of the Zernike polynomials of the wave front deviation of the lithographic image, at least one location in the image plane being weighted differently in the target function of the corresponding optimization problem as compared to the coefficients at other locations in the image plane.

According to a further embodiment of the invention the adjustment of the imaging behavior is performed by reducing the wave front deformation in the image plane only for radiation components traversing the projection objective in selected pupil segments. This adjustment is referred to later as "region of interest" correction.

According to a further embodiment of the invention a first actuator and a second actuator are used for adjusting the imaging behavior of the projection exposure tool, wherein each of the actuators allow a first imaging error to be modified and the first actuator allows also a second imaging error to be modified, the response of the second imaging error being smaller than the response of the first imaging error to a given manipulation of the first actuator, and the actuators are only manipulated for minimizing the second imaging error in case the response of the second imaging error to the given manipulation of the first actuator is above a given threshold. The threshold can e.g. be at $\frac{1}{100}$, i.p. $\frac{1}{10}$ of the response of the first imaging error to the given manipulation of the first actuator.

According to a further embodiment of the invention at least one lithographic imaging error having an impact on the lithographic image for the given layout is determined, the imaging behavior of the projection objective is adjusted in order to correct the change in the optical properties of the projection objective caused by the electromagnetic radiation such that the at least one lithographic imaging error is reduced, wherein the reduction of the lithographic imaging error has a higher priority than a smoothing of the overall wave front deviation of the lithographic image. This embodiment is illustrated further below with respect to a third aspect of the invention. All embodiments and variations referred to in this context can also be applied to the method and control apparatus according to the first aspect of the invention.

According to a variation of the invention the imaging behavior of the projection exposure tool is adjusted before performing the imaging of the object structures and/or dynamically during the imaging process. Therefore e.g. the imaging behavior can be adjusted prior to each exposure of a single wafer or a batch of wafers. Alternatively or additionally an adjustment can be made continuously during the exposure, correcting the lens heating effects dynamically.

According to a further embodiment of the invention the electromagnetic radiation causes during the imaging a change in optical properties of at least one single optical element of the projection objective, a heat distribution induced into the optical element by the electromagnetic radiation during the imaging process is determined, and a resulting temperature distribution in the optical element is calculated from the determined induced heat distribution via a temperature distribution function. The heat distribution is caused by absorption of a portion of the electromagnetic radiation by the optical element. The temperature distribution function is an analytical function of the heat distribution and contains thermal eigenmodes of the optical element. Further, the object structures are imaged into the image plane, wherein the imaging behavior of the projection exposure tool is adjusted on the basis of a change of the optical properties of the optical element derived from the calculated temperature distribution. The heat distribution is preferably time-dependent. This embodiment is illustrated further below with respect to a second aspect of the invention. All embodiments and variations referred to in this context can also be applied to the method and control apparatus according to the first aspect of the invention.

According to a second aspect of the invention a further method of operating a projection exposure tool for microlithography is provided. The projection exposure tool has a projection objective for imaging object structures on a mask into an image plane using electromagnetic radiation, during which imaging the electromagnetic radiation causes a change in optical properties of at least one single optical element of the projection objective. The method according to the second aspect comprises the steps of determining a heat distribution induced into the optical element by the electromagnetic radiation during the imaging process, and calculating a resulting temperature distribution in the optical element from the determined induced heat distribution via a temperature distribution function. The temperature distribution function is an analytical function of the heat distribution and contains thermal eigenmodes of the optical element. Further the method comprises the step of imaging the object structures into the image plane, wherein the imaging behavior of the projection exposure tool is adjusted on the basis of a change of the optical properties of the optical element derived from the calculated temperature distribution in order to at least partly compensate for the change of the optical properties of the optical element caused by the electromagnetic radiation during the imaging process. An optical element referred to here can in particular be a wave shaping element like e.g. a lens element or a reflective element.

Further, according to the second aspect of the invention a further control apparatus for operating a projection exposure tool for microlithography is provided. The projection exposure tool comprises a projection objective for imaging object structures on a mask into an image plane using electromagnetic radiation, during which imaging the electromagnetic radiation causes a change in optical properties of at least one single optical element of the projection objective. The control apparatus according to the second aspect comprises a processing device configured to calculate a resulting temperature distribution in the single optical element from a heat distribution induced into the optical element by the electromagnetic radiation during the imaging process, wherein the resulting temperature distribution is calculated via a temperature distribution function of the single optical element, which temperature distribution function is an analytical function of the heat distribution and contains thermal eigenmodes of the optical element. The control apparatus further comprises an adjustment device configured to adjust the imaging behavior of the projection exposure tool on the basis of a change of the optical properties of the optical element derived from the calculated temperature distribution in order to at least partly compensate for the change of the optical properties of the optical element caused by the electromagnetic radiation during the imaging process. According to the invention further a projection exposure tool is provided comprising the above control apparatus.

By using the analytical temperature distribution function containing thermal eigenmodes the resulting temperature distribution in the optical element can be calculated for the specific optical element simply by inserting the induced heat distribution into the temperature distribution function. This way the temperature distribution can be obtained with much less computational effort and much faster than it is possible by a conventional calculation e.g. based on finite element (FE) calculations. The temperature distribution function is calculated respectively once for each of all relevant optical elements by precalculating the temperature distributions of all relevant thermal eigenmodes. Depending on the mask and the illumination setting used, the temperature distribution can be calculated easily by determining the induced heat distribution for a specific combination of mask layout and illumination setting and inserting the same into the predetermined temperature distribution function.

The method according to the second aspect of the invention therefore allows a calculation of the temperature distribution with a high temporal resolution, i.e. at points in time separated by a very short time interval. Therefore the calculation of the heat propagation in the optical element can be simulated more precisely. In particular the resulting adjustment of the imaging behavior of the projection exposure tool can be performed with a high temporal resolution as well. It may even be possible to calculate the temperature propagation in real time during the imaging process. This way the effects of the radiation-induced changes on the lithographic image can be contained particularly well. According to an embodiment of the invention the temperature distribution function of the optical element is provided as a function of time.

According to an embodiment of the invention the temperature distribution function of the optical element is provided as a function of time, i.e. the temperature distribution function is time dependent. Further, the determined heat distribution induced into the optical element is advantageously time dependent.

According to a further embodiment of the invention the temperature distribution function is provided by solving a heat transport equation of the optical element via an eigenvalue and eigenmode analysis. As mentioned above the temperature distribution function only has to be calculated once for each relevant optical element of the projection objective by pre-calculating the temperature distributions of all relevant thermal eigenmodes of the optical element. Advantageously, the thermal eigenmodes of the optical element are provided together with the projection objective. According to one variation the temperature is considered to be constant in direction of the optical axis of the optical element in the heat transport equation of the optical element, i.e. the temperature is considered z-independent with the optical axis extending in the z-direction.

According to a further embodiment of the invention a layout of the object structures on the mask, and in particular an illumination mode, defining the angular distribution of the radiation illuminating the mask during the imaging process, is provided and the heat distribution induced into the optical element is determined from the layout of the object structures, and in particular the illumination mode. This can be done by calculating the angular distribution of the electromagnetic radiation entering the projection objective, e.g. according to the method described with regard to the first aspect of the invention. From the angular distribution of the radiation entering the projection objective the intensity distributions at the respective optical surfaces of the relevant optical elements can be calculated. Therefrom the respective induced heat distributions can be determined.

According to a further variation the layout of the object structures is used for classifying the object structures according to their type of structure and their location on the mask and the heat distribution induced into the optical element is calculated on the basis of the classification of the object structures.

According to a further embodiment of the invention the layout of the object structures on the mask to be imaged, and in particular the illumination mode, is provided and the object structures are classified according to their type of structure, the change in the optical properties of the projection objective during the imaging process is calculated on the basis of the classification of the object structures, and the imaging behavior of the projection exposure tool is adjusted on the basis of the calculated change of the optical properties in order to at least partly compensate for the change of the optical properties of the projection objective caused by the electromagnetic radiation during the imaging process. This embodiment is illustrated above with respect to a first aspect of the invention. All embodiments and variations referred to in this context can also be applied to the method and control apparatus according to the second aspect of the invention.

According to a further embodiment of the invention a respective temperature distribution is calculated for several or all optical elements of the projection objective and the imaging behavior of the projection exposure tool is adjusted on the basis of a change of the optical properties of the respective optical elements derived from the calculated temperature distributions.

According to a further embodiment of the invention a layout of the object structures on the mask to be imaged is provided and at least one lithographic imaging error having an impact on the lithographic image for the given layout is determined, and the imaging behavior of the projection objective is adjusted for correcting the change in the optical properties of the projection objective caused by the electromagnetic radiation such that the at least one lithographic imaging error is reduced, wherein the adjustment of the imaging behavior of the projection objective is performed such that the reduction of the lithographic imaging error is effected thereby with a higher priority than a smoothing of the overall wave front deviation of the lithographic image. According to a variation the illumination mode used for the imaging process is provided and the at least one lithographic imaging error having an impact on the lithographic image for the given layout is determined based on the illumination mode. This embodiment is illustrated further below with respect to a third aspect of the invention. All embodiments and variations referred to in this context can also be applied to the method and control apparatus according to the second aspect of the invention.

According to a third aspect of the invention a further method of operating a projection exposure tool for microlithography is provided. The projection exposure tool comprises a projection objective for imaging object structures on a mask into an image plane using electromagnetic radiation, during which imaging the electromagnetic radiation causes a change in optical properties of the projection objective. The method according to the third aspect of the invention comprises the step of providing a layout of the object structures on the mask to be imaged and determining at least one lithographic imaging error having an impact on the lithographic image for the given layout. Further, the method comprises the step of imaging the object structures into the image plane, wherein the imaging behavior of the projection objective is adjusted for correcting the change in the optical properties of the projection objective caused by the electromagnetic radiation such that the at least one lithographic imaging error is reduced, wherein the adjustment of the imaging behavior of the projection objective is performed such that the reduction of the lithographic imaging error is effected thereby with a higher priority than a smoothing of the overall wave front deviation of the lithographic image. In an embodiment according to the third aspect of the invention the mask is illuminated during the imaging process with the electromagnetic radiation in a specific illumination mode, defining the angular distribution of the radiation illuminating the mask, and the at least one lithographic error is determined taking the illumination setting into account.

Further, according to the third aspect of the invention a further control apparatus for operating a projection exposure tool for microlithography is provided. The projection exposure tool comprises a projection objective for imaging object structures on a mask into an image plane using electromagnetic radiation, during which imaging the electromagnetic radiation causes a change in optical properties of the projection objective. The control apparatus comprises an input device for receiving the layout of the object structures on the mask to be imaged, and a processing device configured to determine at least one lithographic imaging error having an impact on the lithographic image for the given layout and to calculate an adjustment setting for correcting the change in the optical properties of the projection objective caused by the electromagnetic radiation such that the at least one lithographic imaging error is reduced, wherein the reduction of the lithographic imaging error is effected thereby with a higher priority than a smoothing of the overall wave front deviation of the lithographic image. Further the control apparatus comprises an adjustment device configured to adjust the imaging behavior of the projection objective according to the calculated adjustment setting. According to the invention further a projection exposure tool is provided comprising the above control apparatus.

In different words according to the third aspect of the invention the layout of the mask to be exposed is analyzed to determine at least one lithographic imaging error being relevant to the lithographic image of the mask in that the quality of lithographic image is deteriorated by the given lithographic imaging error. A lithographic imaging error in this context is an error observable in the lithographic image of the mask. Such a lithographic imaging error can e.g. be an astigmatism error, in case the mask layout contains orthogonally oriented structures affected by the astigmatism error. As a result of this error the planes of the orthogonally oriented structures are shifted by the error. Another example of a lithographic imaging error is a coma error, which causes a shift of mask structures relative to each other in the image plane. A lithographic imaging error in particular can be described by lithographic parameters like "best focus range" and "overlay". A lithographic imaging error therefore is defined in contrast to e.g. higher order aberrations of the wave front, which can only be measured by an interferometer, or wave front errors which do not influence the imaging of a given mask layout.

According to the third aspect of the invention the imaging behavior of the projection objective is adjusted in order to reduce or minimize the at least one lithographic imaging error determined for the given mask layout. This is done with a higher priority than a smoothing of the overall wave front deviation of the lithographic image. Therefore a consequence of the adjustment may be that the overall wave front deviation does not becoming as smooth with regard to absolute deviations and/or gradients of the deviation as it would be possible if the reduction of the determined lithographic imaging error was not given priority. The wave front deviation may even become less smooth than it would be without the adjustment. As a result of this also other lithographic imaging errors having an impact on the lithographic image and especially lithographic imaging errors having little impact for the given layout may be magnified as a result.

According to the third aspect of the invention therefore intentional priorities are set regarding the correction of the imaging behavior of the projection objective due to radiation-induced effects. This way a smart optimization of the lithographic image is achieved, which optimization is customized to the layout of the given mask to be exposed. This way the effects of the radiation-induced changes on the lithographic image are kept within a narrow range.

According to a further embodiment of the invention at least one imaging error is reduced selectively regardless of at least one other imaging error having an impact on the lithographic image for the given layout being magnified as a result of the adjustment. According to a further variation the lithographic imaging error being reduced has a larger impact on the lithographic image for the given layout than the lithographic imaging error being magnified as a result of the adjustment.

According to a further embodiment of the invention a subgroup of lithographic imaging errors is determined, which subgroup contains the most relevant lithographic imaging errors with respect of the given layout of the object structures in that these imaging errors have the largest impact on the lithographic image for the given layout, and the imaging behavior of the projection objective is adjusted in order to correct the change in the optical properties of the projection objective caused by the electromagnetic radiation such that at least one imaging error of the subgroup of lithographic imaging errors is reduced selectively regardless of imaging errors not contained in the subgroup being magnified as a result of the adjustment. A selective adjustment of at least one imaging error of the subgroup in this context in particular means that at least another imaging error not contained in the subgroup remains unadjusted.

According to a further embodiment of the invention the imaging behavior of the projection objective is adjusted such that the extent of the reduction of the imaging error achieved thereby is basically independent of the pitch of object structures, regarding which the imaging error is relevant in that the image of these object structures is affected by the imaging error.

According to a further embodiment of the invention the imaging error being reduced causes orthogonally oriented object structures to be focused into different average focus planes. Such an imaging error is also referred to as astigmatism or H-V focal difference.

According to a further embodiment of the invention the imaging behavior of the projection objective is adjusted by adjusting the coefficient of the Zernike polynomial Z5 and/or Z6 in the wave front deviation of the lithographic image such that the distance between resulting average focus planes of orthogonally oriented object structures is minimized. In particular the coefficient of the Zernike polynomial Z5 (and/or Z6) is adjusted such that average focus differences between horizontal and vertical structures (and/or 45° and 135° rotated structures) with several pitches are minimized. Alternatively or additionally also the coefficient of the Zernike polynomial Z17 can be adjusted. This way a H-V (and/or)45°-135° focal difference can be manipulated basically independent of the pitch of the structures. The pitch of the structures is a characteristic periodicity of the structures, as known to the person skilled in the art.

According to a further embodiment of the invention the imaging error being reduced includes a linear magnification error and/or a distortion error of third order of the projection objective.

According to a further embodiment of the invention the imaging error being reduced causes the images of orthogonally oriented object structures to be shifted differently in the image plane. This can mean a shift either in different directions and/or to different extents in the same direction.

According to a further embodiment of the invention the imaging behavior of the projection objective is adjusted by adjusting the coefficient of the Zernike polynomial Z2 and/or Z3 in the wave front deviation of the lithographic image such that the pitch averaged magnification, third order distortion and a/or constant lateral shift of structures are minimized. This way a pattern shift in the image plane can be manipulated basically independent of the pitch of the structures.

According to a further embodiment of the invention the object structures are classified according to their type of structure, the change in the optical properties of the projection objective during the imaging process is calculated on the basis of the classification of the object structures, and the imaging behavior of the projection exposure tool is adjusted on the basis of the calculated change of the optical properties in order to at least partly compensate for the change of the optical properties of the projection objective caused by the electromagnetic radiation during the imaging process. This embodiment is illustrated above with respect to a first aspect of the invention. All embodiments and variations referred to in this context can also be applied to the method and control apparatus according to the third aspect of the invention.

According to a further embodiment of the invention the electromagnetic radiation causes during the imaging process a change in optical properties of at least one single optical element of the projection objective. According to the embodiment a temperature distribution function of the single optical element is provided, which temperature distribution function is an analytical function of an incoming heat distribution absorbed by the optical element and contains thermal eigenmodes of the optical element, a heat distribution induced into the optical element by the electromagnetic radiation during the imaging process is determined, the resulting temperature distribution in the optical element is calculated from the determined induced heat distribution via the temperature distribution function, and the object structures are imaged into the image plane, wherein the imaging behavior of the projection exposure tool is adjusted on the basis of a change of the optical properties of the optical element derived from the calculated temperature distribution. This embodiment is illustrated further below with respect to a second aspect of the invention. All embodiments and variations referred to in this context can also be applied to the method and control apparatus according to the third aspect of the invention.

The features specified above with respect to the method according to any one of the above detailed aspects of the invention can be transferred correspondingly to the control apparatus and the projection exposure tool according to the invention. Advantageous embodiments of the control apparatus and the projection exposure tool according to the invention resulting therefrom shall be covered by the disclosure of the invention.

BRIEF DESCRIPTION OF THE DRAWINGS

The foregoing as well as other advantageous features of the invention will be more apparent from the following detailed description of exemplary embodiments of the invention with reference to the following diagrammatic drawings, wherein.

DETAILED DESCRIPTION OF EXEMPLARY EMBODIMENTS

Figure 1:
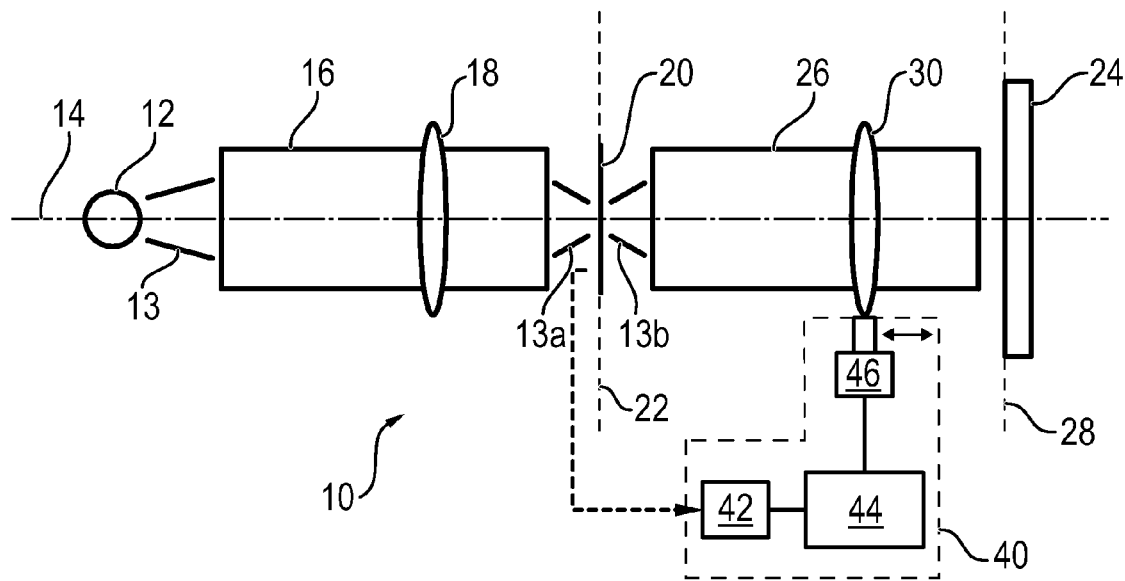
FIG. 1 illustrates a projection exposure tool for microlithography having a projection objective for imaging a mask onto a substrate.

In the embodiments of the invention described below, components that are alike in function and structure are designated as far as possible by the same or alike reference numerals. Therefore, to understand the features of the individual components of a specific embodiment, the descriptions of other embodiments or the summary of the invention should be referred to.

FIG. 1 shows a greatly simplified block diagram of a projection exposure tool 10 for microlithography. The projection exposure tool 10 comprises a radiation source 12, producing electromagnetic radiation 13 having a wavelength in the UV-region e.g. comprising 248 nm or 193 nm, or in the extreme ultraviolet wavelength region (EUV), in particular having a wavelength below 100 nm, e.g. 13.4 nm. The source 12 is situated in the exemplary embodiment depicted on an optical axis 14, defined by the components of the projection exposure tool described in the following.

The radiation produced by the radiation source 12 is taken to an illumination system 16, having a plurality of optical elements 18, e.g. in the form of lenses and/or mirrors, only one of which is shown symbolically. The illumination system 16 serves to illuminate a mask 20 arranged after the illumination system 16 in the beam path, which is also referred to as a reticle, and is situated in an object plane 22. The illumination system 16 can be configured, in particular, such that an angular distribution of the radiation 13 irradiating the mask 20, referred to as illumination mode, can be adapted to the mask 20 being used.

The mask 20 carries object structures to be imaged onto a substrate 24 in form of a wafer. For this purpose the object structures on the mask 20 are projected via a projection objective 26 arranged after the mask 20 in an image plane 28, which follows the projection objective 26. Similar to the illumination system 16, the projection objective 26 also comprises a plurality of optical elements 30, e.g. in the form of lenses or mirrors, only one of which is shown symbolically. In case the optical elements 18 and/or 30 are configured as lenses they can consist, for example, of quartz glass (fused silica) or calcium fluoride.

The substrate 24 is arranged in the image plane 28 of the projection objective 26, which substrate 24 comprises a photosensitive layer to be exposed via the projection exposure tool 10. Thereby the object structures on the mask 20 are transferred onto the substrate 24 in an imaging process.

After exposure of the substrate 24, the substrate 24 undergoes processing on the basis of the structures created by the exposure in the photosensitive layer. After this, an additional exposure and a further processing based on that can follow. This procedure is repeated as often as it takes for the substrate 24 to have all desired structures.

In order to achieve short exposure times, radiation of very high intensity is used for the exposure. This leads to the consequence that the optical elements 30 of the projection objective 26 are subjected to a very intense bombardment with radiation. What makes this even more critical, the radiation exposure for at least some of the optical elements 30 is not distributed uniformly over their entire useable surface, but rather concentrated in partial regions which are sometimes much smaller than the useable surface. Hence, very high intensities can occur locally, which can result in radiation-induced changes in the properties of the optical elements 30. As already detailed above, for example, absorbed radiation in an optical element, e.g. a lens or a mirror, can have the effect of a localized temperature change in the optical element, which may result in a localized refractive index and surface change in the optical element. This effect is a reversible, short-term effect and known as "lens heating". Further, radiation can result in irreversible, long-term effects in the lens known as "life-time effects". Such effects include compaction (increased density) or rarefaction (reduced density) of the lens.

The described radiation-induced changes and possibly other changes in the optical properties of the optical elements 30 can result in a nonuniform intensity, a fluctuating polarization state, aberrations, and so on.

The radiation-induced changes in the optical properties of the optical elements 30 with increasing irradiation time can result in the projection objective 26 no longer fulfilling the given specifications and thus the projection exposure tool 10 no longer being usable for the designated purpose. Under which conditions of use of the projection exposure tool 10 an unacceptable deviation from the specification will occur depends largely on the distribution of the radiation in the single optical elements 30 during the imaging process.

The distribution of the radiation in the optical elements 30 can be deduced from a diffraction angle distribution of radiation 13b generated by the mask 20, which is the angular distribution of the radiation 13b entering the projection objective 26. The diffraction angle distribution is dependent on the angular distribution of the illumination radiation 13a irradiating the mask 20, which is defined by the illumination mode used by the illumination system 16 as already mentioned above. Examples of such illumination modes, also referred to as illumination settings, are dipole, annular and quadrupole illumination, etc. The diffraction angle distribution of the radiation 13b is further dependent on the layout of the mask 20. A precise calculation of the diffraction angle distribution can be performed by first calculating the Fourier transform of the mask layout and subsequently calculating the convolution of the Fourier transform of the mask layout with the angular distribution of the illumination radiation 13a. For this calculation all object structures contained on the respective mask 20 have to be included. Thus generally large computing resources are needed for this calculation.

Figure 2:
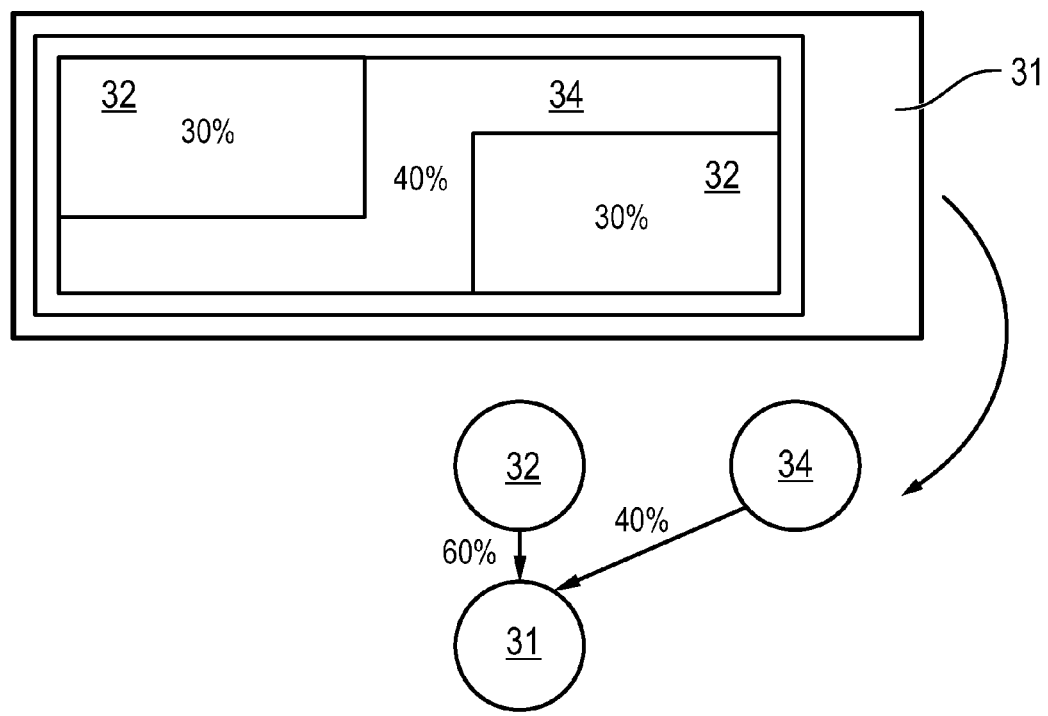
FIG. 2 depicts an exemplary chip layout on the mask illustrating regions of different types of object structures.

In order to allow the diffraction angle distribution of the radiation 13b to be calculated with less computing resources and in a shorter time according to the invention first a classification of the object structures contained on the mask 20 is performed. As illustrated in FIG. 2 in form of an example of a full chip layout written on the mask 20, the layout of the object structures on the mask 20 is analyzed and the object structures are classified according to their type of structure. Thereby the mask area is portioned into several types of regions, e.g. a so called cell area 32 containing densely arranged object structures and a so called periphery 34 containing sparsely arranged object structures compared to the arrangement density of the structures in the cell area 32. The classification criteria of the structures can e.g. further include orientations of the object structures and shape types. Further the relative areas or sizes of the classified regions are determined. In the example shown in FIG. 2 there are two cell areas, each covering 30% of the area of the full chip 31, while the remaining area of 40% is covered by the periphery 34. Therefore the object structures of the type "cell area" are assigned an area of 60% and the object structures of the type "peripery" an area of 40%.

This classification is performed in a control apparatus 40 shown in FIG. 1. The control apparatus 40 comprises an input device 42, a processing device 44 and an adjustment device 46, and can be fully integrated into the projection exposure tool 10. Alternatively, the input device 42 and the processing device 44 can be separate from the projection exposure tool 10. The input device 42 is configured for receiving the layout of the object structures on the respective mask 20 to be exposed. The processing device 44 performs the classification of the object structures described above.

Subsequently the processing device 44 calculates a change in the optical properties of the projection objective 26 on the basis of the classification of the object structures. Compared to the above mentioned rigorous calculation of the change this calculation is less accurate and may therefore also be referred to as approximation. For this purpose a diffraction angle distribution of the radiation 13b is calculated for each single type of object structure determined in the classification. This is done analogously to the way described above with respect to calculating the diffraction angle distribution from the full mask layout. According to the invention, first the Fourier transform of the layout of the respective object structure is calculated and subsequently the convolution of the Fourier transform of the object structure with the angular distribution of the illumination radiation 13a is calculated. The result is a fictitious effective pupil for each of the types of object structures determined in the classification.

Figure 3:
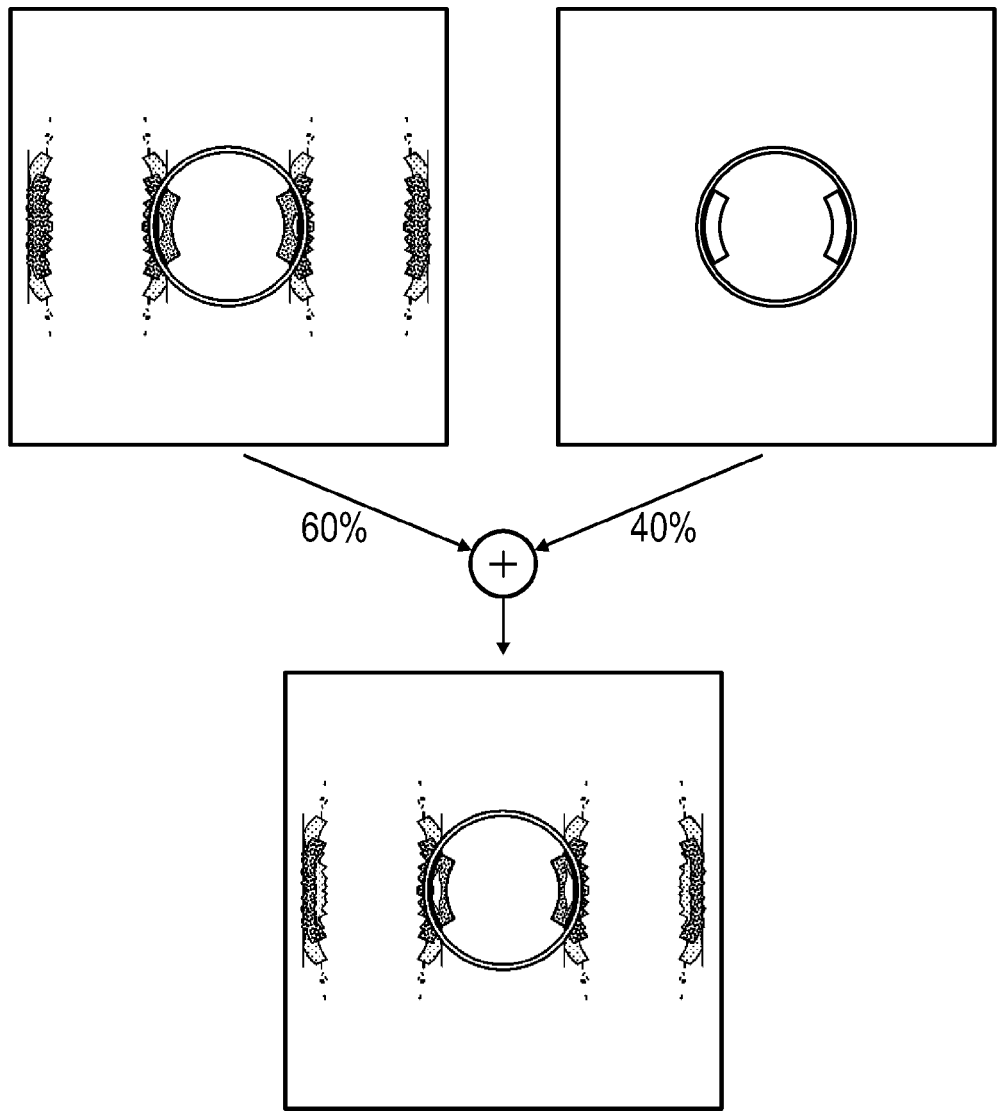
FIG. 3 illustrates the combination of diffraction angle distributions generated by different types of object structures.

FIG. 3 shows an example of the diffraction angle distribution of the radiation 13b calculated for the object structure types of FIG. 2. The left upper graph of FIG. 3 shows the diffraction angle distribution calculated for the densely arranged "cell area" type object structures being illuminated in a dipole illumination mode. The right upper graph of FIG. 3 shows the diffraction angle distribution calculated for the sparsely arranged "periphery" type object structures. The "periphery" type object structures were simulated by a region containing no structures at all, also referred to as open frame. In the right graph therefore only the angular distribution of the dipole illumination is depicted.

Subsequently, an approximated overall angular distribution of the radiation 13b is calculated from the weighted sum of the angular distributions for the single classified types of object structures. Thereby the individual angular distributions are respectively weighted by the determined relative sizes of the mask areas covered by the respective types of structures and the transmissions of the areas. In the example illustrated in FIGS. 2 and 3 the fictitious angular distribution or pupil for the cell area 32 is weighted by 60% and the fictitious angular distribution or pupil for the periphery 34 is weighted by 40%. The weighted sum, exemplary shown in the lower graph of FIG. 3, is an approximation of the angular distribution or pupil of the full chip 31 on the mask 20. Typically one mask 20 contains several identical chips 31. In this case the determined pupil of the full chip 31 corresponds to the pupil of the total mask 31.

Subsequently the processing device 44 calculates a change in the optical properties of the projection objective 26 effected during the imaging process from the determined overall angular distribution of the radiation 13b entering the projection objective 26. This can be done by calculating a heat distribution induced into the single optical elements 30 of the projection objective 26 from the determined overall angular distribution of the radiation 13b. For this the distribution of the radiation 13b on the respective face and in the volume of the single optical elements 30 is determined and the propagation of the heat produced from the radiation 13b in the optical elements 30, which can be in the form of lenses, is calculated to obtain a time resolved heat distribution in the respective optical element. An example of a method of for calculating the heat propagation according to the invention is illustrated below in detail.

From the calculated time resolved heat distribution in the optical elements 30 a change in the optical properties of the respective optical elements 30, e.g. a refractive index changes and surface deformations, is determined. From this change in the optical properties of the optical elements 30 the processing device 46 calculates adjustments to the projection exposure tool 10 necessary in order to compensate for this change in the optical properties and controls an adjustment device 46 to perform such adjustments. The adjustments to the projection exposure tool 10 may be made to the optical elements 30 in which the optical properties have changed or to other optical elements 30. With these adjustments in particular the imaging behavior of the projection objective 26 is adjusted. Alternatively or additionally it may be useful to adjust the imaging behavior of the overall projection exposure tool 10 by e.g. manipulating optical elements 18 of the illumination system 16. Generally the adjustment is performed using manipulators, which can be of different type. A number of manipulators will be mentioned at various locations of the following text.

Figure 10:
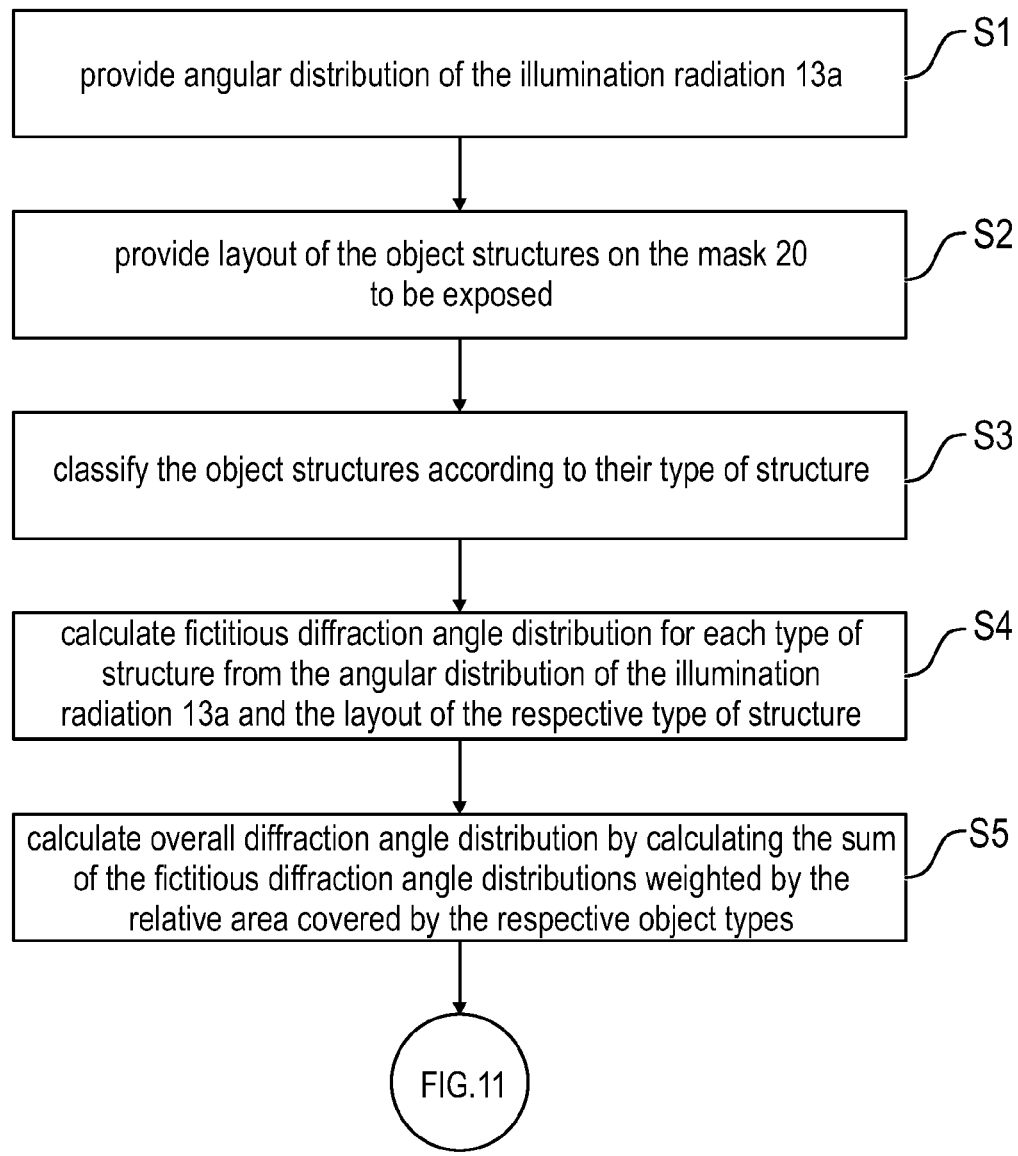
FIG. 10 is a first part of a flow chart including steps S1 to S5 illustrating an embodiment of a method of operating a projection exposure tool according to the invention.
Figure 11:
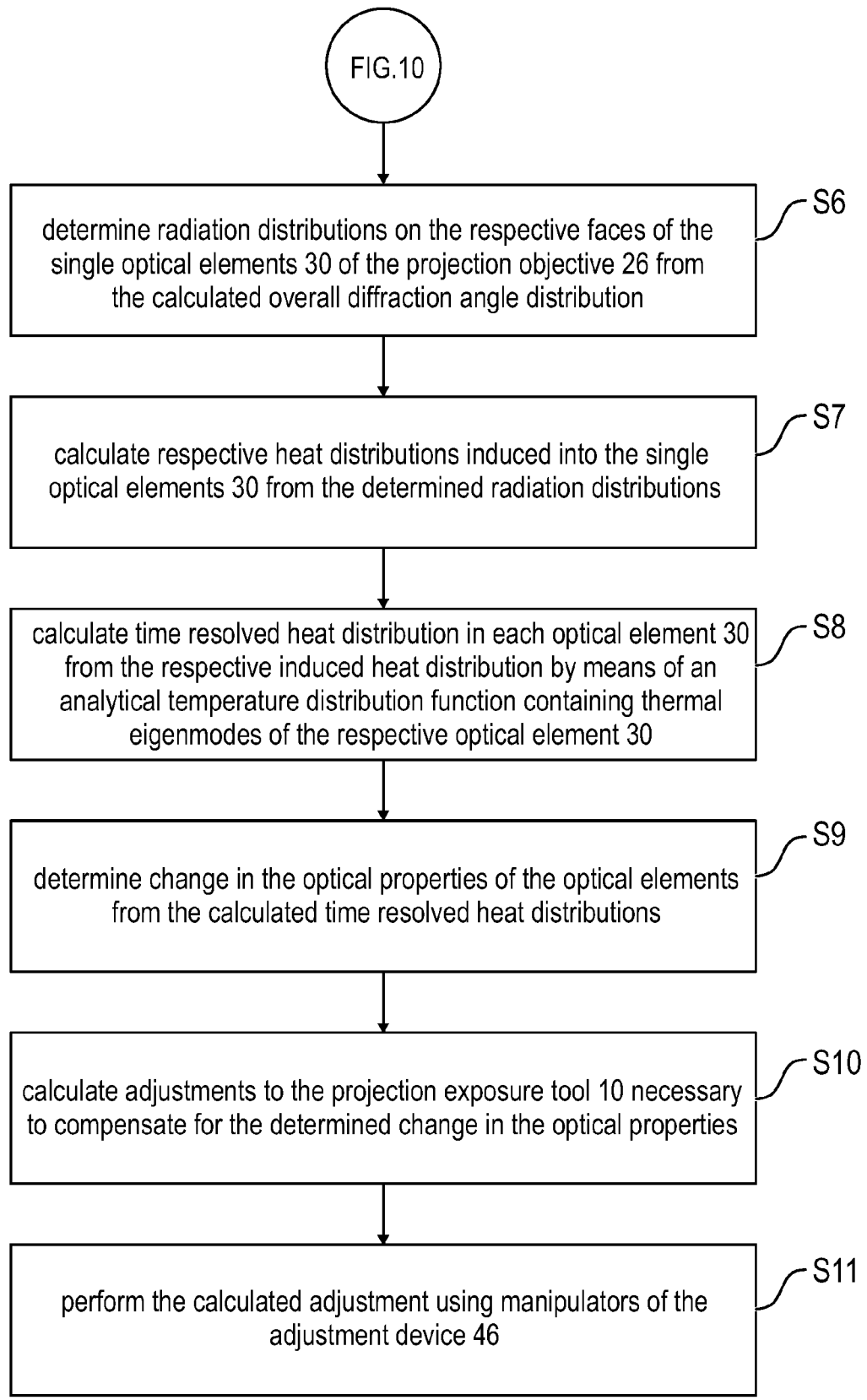
FIG. 11 is a second part of the flow chart including steps S6 to S11 of the embodiment of a method of operating a projection exposure tool.

FIGS. 10 and 11 contain a flow chart illustrating an embodiment of a method of operating a projection exposure tool according to the invention. The method includes steps S1 to S11, which steps have been described in more detail above without explicit reference to the step numbers. Other embodiments of the method according to the invention comprise only some of the steps S1 to S11 as disclosed in the description of the invention.

According to one embodiment of the invention the calculation of the necessary adjustments to the optical elements 30 to compensate the change in the optical properties of the optical elements 30 is performed by first calculating a deviation of the wave front in the image plane 28 resulting from the change in the optical properties calculated. From the deviation of the wave front the necessary adjustments are calculated in order to compensate for the calculated wave front deviation. In one variation the target of the adjustments can be to obtain an as smooth as possible wave front. In another variation illustrated in detail further below the priority can be the reduction of certain lithographic imaging errors.

The adjustment device 46 of FIG. 1 comprises manipulators arranged at the respective optical elements 30. For exemplary illustration the adjustment device 46 in FIG. 2 is depicted as a moving manipulator for moving an optical element along the optical axis 14. Additional or alternative manipulators can be configured to turn an optical element with respect to the optical axis 14 or to deform an optical element 20, especially in form of a mirror. Alternatively or additionally it is also possible to manipulate other parameters of the exposure tool, like optical elements in the illumination system, in order to adjust the imaging behavior accordingly. Examples of suitable manipulators are for example illustrated in US 2004/0144915 A1, which document is included herein by reference. Other examples are referred to also below.

The adjustment of the imaging behaviour of the projection exposure tool 10, e.g. by manipulating single optical elements 30 of the projection objective 26, can be performed before the exposure of a substrate 24. Alternatively the adjustment can be performed dynamically during the imaging process by continuously correcting errors occurring in the process of the exposure due to the incoming radiation.

As mentioned above the adjustment of the imaging behavior of the projection exposure tool can e.g. be performed by manipulation of the position or the shape of suitable lens elements in the projection objective 26 using actuators. Depending on the design of the projection objective 26 it may be possible to correct the wave front deviation of the whole projection objective 26 by manipulating only a sub-group of all lens elements or possibly even only one lens element. In some designs it is possible to correct the wave front deviation approximately by a so-called equivalent lens element, which can be a lens element in or close to the pupil plane of the projection objective 26.

In the following an embodiment of a method according to the invention is illustrated for calculating the heat propagation in a single optical element 30 in form of a lens element of the projection objective 26 in detail. This is done by calculating the resulting temperature distribution in the lens element resulting from a heat distribution induced into the lens element. As explained above, the heat distribution induced into the lens element is derived from the angular distribution of the radiation 13b entering the projection objective 26. The method according to this embodiment of the invention allows the computation of lens heating without the use of a finite element method (FEM). Compared to the use of FEM the method according to this embodiment allows lens heating effects to be computed faster.

For modeling of lens heating in a lens element based on quartz, calcium fluoride or other glass the heat equation is solved with given boundary conditions. The heating process inside a lens is a consequence of absorbing electromagnetic radiation in the bulk material of the lens, e.g. made of glass, and the coatings applied thereon.

In the following a model for calculating the heat transport within an optical element 30 in form of a lens of the projection objective according to the invention is illustrated referring to the lens element 50 shown in FIG. 4. The lens element 50 is described using a cylindrical coordinate system, wherein the z-coordinate axis corresponds to the optical axis 52 of the lens element 50. The coordinate $\rho$ refers to the distance from the z-axis and pp to the angular coordinate or azimuth. In the following model according to the invention convection in the environment or gas flow is not considered. Further, the z-dependence inside the lens is not considered. This is justified as the results show that the foot-print of the lens heating does not change very much from one side of the lens to the other.

The model allows the calculation of a resulting temperature distribution in the lens element 50 from an induced heat distribution via an analytical temperature distribution function containing eigenmodes of the optical element.

In a first section an analytical part of the inventive modeling is illustrated resulting in a heat equation of the lens element 50 in a form to be solved numerically.

Equation (1) is a time dependent heat equation for a heat source W(t, ρ, φ), also referred to in this application as induced or incoming heat distribution:

$$\frac{\partial \vartheta}{\partial t} - div(\sigma grad\vartheta) = W(t, \rho, \varphi), \tag{1}$$

wherein $\vartheta$ is the temperature and t the time. The parameter σ is defined as follows:

$$\sigma = \frac{\lambda}{\rho' c_r}, \tag{2}$$

wherein λ is the thermal conductivity, ρ' the density and $c_r$ the specific heat capacity of the bulk material of the lens element 50. As already indicated above the temperature $\vartheta$ is considered as z-independent:

$$\frac{\partial \vartheta}{\partial z} = 0. \tag{3}$$

With this assumption equation (1) can be written as follows:

$$\frac{\partial \vartheta}{\partial t} - \frac{\sigma}{\rho^2}\frac{\partial^2 \vartheta}{\partial \varphi^2} - \frac{1}{\rho}\frac{\partial}{\partial \rho}\sigma\rho\frac{\partial \vartheta}{\partial \rho} = W(t, \rho, \varphi) \tag{4}$$

Equation (4) is the differential equation to be solved. A mathematical approach is chosen which allows to consider the three dimensional geometry of lens element 50. As the assumption is made that heat only flows radially (ρ) in the lens element towards a mounting of the lens and no heat flow through the lens surface 54 is considered. The heat flow follows the shortest way to the heat sink and therefore to the outer boundary of the mounting of the lens element 50.

Figure 4:
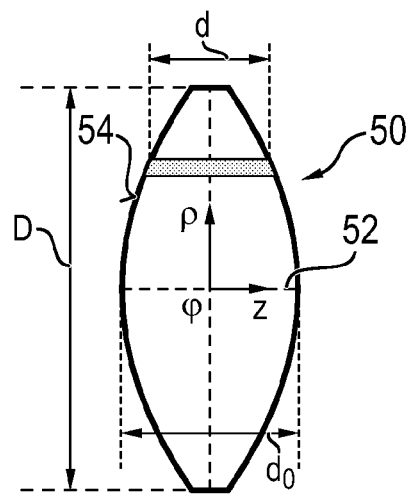
FIG. 4 shows a cross section of an exemplary lens of the projection objective of FIG. 1.

Referring to FIG. 4 the thermal conductivity λ can be expressed as a function of the lens radius ρ as follows:

$$\lambda(\rho) = \lambda_0 \frac{d(\rho)}{d_0}, \tag{5}$$

wherein $\lambda_0$ is the thermal conductivity at the center of the lens element 50 and $d_0$ is the center thickness.

The heat equation (4) is solved by separation of time and space:

$$\theta(t,\rho,\phi)=\theta_t(t)\theta_{\rho,\phi}(\rho,\phi) \tag{6}$$

Using the latter assumptions the homogeneous heat equation, in which W (t,ρ,φ)=0, can be written as:

$$\frac{1}{\vartheta_t}\frac{\partial \vartheta_t}{\partial t} - \frac{1}{\vartheta_{\rho,\varphi}}\left[\frac{\sigma}{\rho^2}\frac{\partial^2 \vartheta_{\rho,\varphi}}{\partial \varphi^2} + \frac{1}{\rho}\frac{\partial}{\partial \rho}\sigma\rho\frac{\partial \vartheta_{\rho,\varphi}}{\partial \rho}\right] = 0, \tag{7}$$

wherein the term $$\frac{1}{\vartheta_{\rho,\varphi}}\left[\frac{\sigma}{\rho^2}\frac{\partial^2 \vartheta_{\rho,\varphi}}{\partial \varphi^2} + \frac{1}{\rho}\frac{\partial}{\partial \rho}\sigma\rho\frac{\partial \vartheta_{\rho,\varphi}}{\partial \rho}\right] \tag{8}$$

is a constant and is called Γ. It is to be noted, that the homogenous heat equation with W (t,ρ,φ)=0 can now be written in two separated differential equations, namely the following time dependent differential equation (9) and the differential equation (10) in ρ and φ.

$$\frac{\partial \vartheta_t}{\partial t} - \Gamma\vartheta_t = 0 \tag{9}$$

$$\left[\frac{\sigma}{\rho^2}\frac{\partial^2}{\partial \varphi^2} + \frac{1}{\rho}\frac{\partial}{\partial \rho}\sigma\rho\frac{\partial}{\partial \rho} - \Gamma\right]\vartheta_{\rho,\varphi} = 0, \tag{10}$$

wherein Γ≡const.

The solution of this of equation (9) is well known and will be introduced later. Equation (10) can be further separated by the following term:

$$\theta_{\rho,\phi}(\rho,\phi)=\theta_\rho(\rho)\theta_\phi(\phi) \tag{11}$$

The equation (10) in φ can be written as:

$$\frac{\partial^2 \vartheta_\varphi}{\partial \varphi^2} + m^2\vartheta_\varphi = 0, \tag{12}$$

wherein $m^2$ is a constant and is defined as follows:

$$m^2 = \frac{1}{\vartheta_\rho}\frac{\rho}{\sigma}\frac{\partial}{\partial \rho}\sigma\rho\frac{\partial \vartheta_\rho}{\partial \rho} - \frac{\rho^2}{\sigma}\cdot\Gamma. \tag{13}$$

Equation (12) can be solved by the term:

$$\theta_\phi(\phi)=A\cos(m\phi)+B\sin(m\phi), \tag{14}$$

because the second derivation of (14) can be written as:

$$\frac{\partial^2 \vartheta_\varphi(\varphi)}{\partial \varphi^2} = -m^2(A\cos(m\varphi) + B\sin(m\varphi)) = -m^2\vartheta_\varphi(\varphi), \tag{15}$$

giving equation (12).

Hence, the variable m describes the azimuthal dependence of the solution.

Equation (10) in ρ can be written as:

$$\left[\frac{1}{\rho}\frac{\partial}{\partial \rho}\sigma\cdot\rho\frac{\partial}{\partial \rho} - \frac{\sigma}{\rho^2}m^2\right]\vartheta_\rho = \Gamma\vartheta_\rho, \text{ or} \tag{16a}$$

$$Q\vartheta_\rho = \Gamma\vartheta_\rho, \tag{16b}$$

wherein $Q = \frac{1}{\rho}\frac{\partial}{\partial \rho}\sigma\cdot\rho\frac{\partial}{\partial \rho} - \frac{\sigma}{\rho^2}m^2$ In the following this equation is solved by a numerical approach using an eigenmode solver.

Equation (16) can be solved numerically by a radial discretization schema. To distinguish between uniform and discrete functions the latter is written with a hat character. The N×N differential operator D for $$\frac{\partial}{\partial \rho}$$

is defined as follows:

$$\hat{D} = \frac{1}{h} \begin{bmatrix} -1 & 1 & & & \\ & -1 & 1 & & \\ & & \ddots & \ddots & \\ & & & -1 & 1 \\ & & & & -1 \end{bmatrix}, \quad (17)$$

wherein N is the number of discretization points in radial (ρ) direction and h is the discretization distance.

The following discretization schema is used:

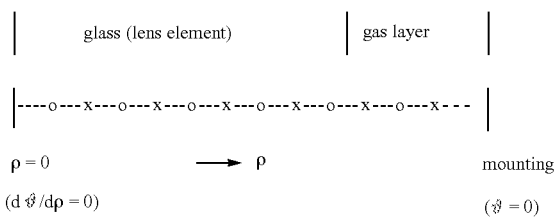

The discretization schema comprises two discrete systems at the points "o" and "x". The temperature $\vartheta$ and its second derivation $d^2\vartheta\, d^2\rho$ is defined at the points "o". The first derivation $d\vartheta/d\rho$ is defined at the points "x". It is noted that on the left side the first derivative of the temperature has to vanish (Neumann boundary conditions). At the right side the boundary conditions of the mounting describe a thermal sink where $\vartheta = 0$ (Dirichlet boundary conditions).

The variables ρ and σ(ρ) can be written as diagonal matrices, where the thermal conductivity at the node between glass and gas layer is considered as the arithmetic mean value of both. With such a gas layer between glass and mounting the non perfect thermal contact to the mounting is included in the model. The thickness of the gas layer is identical to the distance between the lens element 50 and the mounting in the conventional approach for calculating the temperature distribution in lenses using finite element calculation, which is known to the person skilled in the art. To find a correlation between the model according to the invention and the finite element calculations the effective thermal conductivity of the gas layer is set as 0.0255 mW/mm/K. Notice, that the value is slightly higher than the thermal conductivity of $N_2$.

The operator Q of equation (16) can be written in discrete form by an operator matrix $\hat{Q}$, where the different discretization schemata must be considered:

$$\hat{Q} = \hat{\rho}_o^{-1} \hat{D}' \hat{\sigma}_x \hat{\rho}_x \hat{D} - \hat{\sigma}_0 \hat{\rho}_0^{-2} \hat{m}^2 \quad (18)$$

The variable $\hat{\theta}_\rho$ is a column vector and $\hat{m}$ is a diagonal matrix. The matrix $\hat{D}'$ is the transposed matrix to $\hat{D}$. With this operator $\hat{Q}$ equation (16b) becomes a numerical eigenvalue problem, the solution of which is well known to the skilled person.

$$\hat{Q}\hat{\theta}_\rho^i = \Gamma_i \hat{\theta}_\rho^i \quad (19)$$

In that case the $\Gamma_i$ is an eigenvalue and $\hat{\theta}_\rho^i$ an eigenvector of $\hat{Q}$, where for the non trivial solution the following determinant has to vanish:

$$det|\hat{Q} - \Gamma_i| = 0 \quad (20)$$

Let $\hat{\Gamma}$ be the diagonal matrix with the eigenvalues $\Gamma_1, \ldots \Gamma_n$.

$$\hat{\Gamma} = \begin{bmatrix} \Gamma_1 & & & & \\ & \Gamma_2 & & & \\ & & \ddots & \ddots & \\ & & & \Gamma_{N-1} & \\ & & & & \Gamma_N \end{bmatrix} \quad (21)$$

Then matrix $\hat{Q}$ can be written as $$\hat{Q} = \hat{T}\hat{\Gamma}\hat{T}^{-1} \quad (22)$$

Notice, that the matrix $\hat{T}$ includes the eigenvectors $\hat{\theta}_\rho^i$ of $\hat{Q}$. The discrete temperature distribution in case of the inhomogeneous heat equation (4), where $W(\rho,\phi) \neq 0$ can be expanded into these solutions of the homogeneous heat equation:

$$\hat{\theta} = \hat{T}\hat{\tilde{\theta}}, \quad (23)$$

wherein the column vector $\hat{\tilde{\theta}}$ describes the expansion coefficients of the eigenvectors.

Using the latter equations the inhomogeneous heat equation (1) can be written as:

$$\frac{\partial \hat{\theta}}{\partial t} - \hat{Q}\hat{\theta} = \hat{W}(\rho, \varphi). \quad (24)$$

Using the definition of $\hat{Q}$ under (22) the equation (24) can be rewritten as:

$$T\frac{\partial \hat{\tilde{\theta}}}{\partial t} - \hat{T}\hat{\Gamma}\hat{T}^{-1}\hat{T}\hat{\tilde{\theta}} = \hat{T}\hat{\tilde{W}}(\rho, \varphi). \quad (25)$$

Therefrom the following matrix equation can be obtained:

$$\frac{\partial \hat{\tilde{\theta}}}{\partial t} - \hat{\Gamma}\hat{\tilde{\theta}} = \hat{\tilde{W}}(\rho, \varphi). \quad (26)$$

The solution of equation (26) is as follows:

$$\hat{\tilde{\theta}} = A\exp(\hat{\Gamma}t) - \hat{\Gamma}^{-1}\overline{\hat{\tilde{W}}}(\rho,\phi) \quad (27)$$

The parameter A is found by considering the boundary condition for t=0:

$$\hat{\tilde{\theta}}(0) = \hat{\tilde{\theta}}_0 = A - \hat{\Gamma}^{-1}\overline{\hat{\tilde{W}}}(\rho,\phi) \quad (28)$$

$$\rightarrow A = \hat{\tilde{\theta}}_0 + \hat{\Gamma}^{-1}\overline{\hat{\tilde{W}}}(\rho,\phi) \quad (29)$$

Hence, the solution (27) can be written as:

$$\hat{\tilde{\theta}} = \exp(\hat{\Gamma}t)(\hat{\tilde{\theta}}_0 + \hat{\Gamma}^{-1}\overline{\hat{\tilde{W}}}(\rho,\phi)) - \hat{\Gamma}^{-1}\overline{\hat{\tilde{W}}}(\rho,\phi) \quad (30)$$

It is noted, that the function $\hat{\tilde{\theta}}$ has to be transformed to the original basis system with:

$$\hat{\theta} = \hat{T}\hat{\tilde{\theta}} \quad \hat{W} = \hat{T}\hat{\tilde{W}} \quad (31)$$

The solution of the time dependent heat equation (1) can therefore be written as follows:

$$\hat{\theta} = \hat{T}\exp(\hat{\Gamma}t)\hat{T}^{-1}(\hat{\theta}(0) + \hat{T}\hat{\Gamma}^{-1}\hat{T}^{-1}\hat{W}) - \hat{T}\hat{\Gamma}^{-1}\hat{T}^{-1}\hat{W}. \quad (32)$$

Therein $\hat{\theta}$ is a column vector containing temperature values and $\hat{W}$ is a column vector containing values of the incoming heat, each for discretized values of $\rho$ and $\phi$, respectively.

Figure 5:
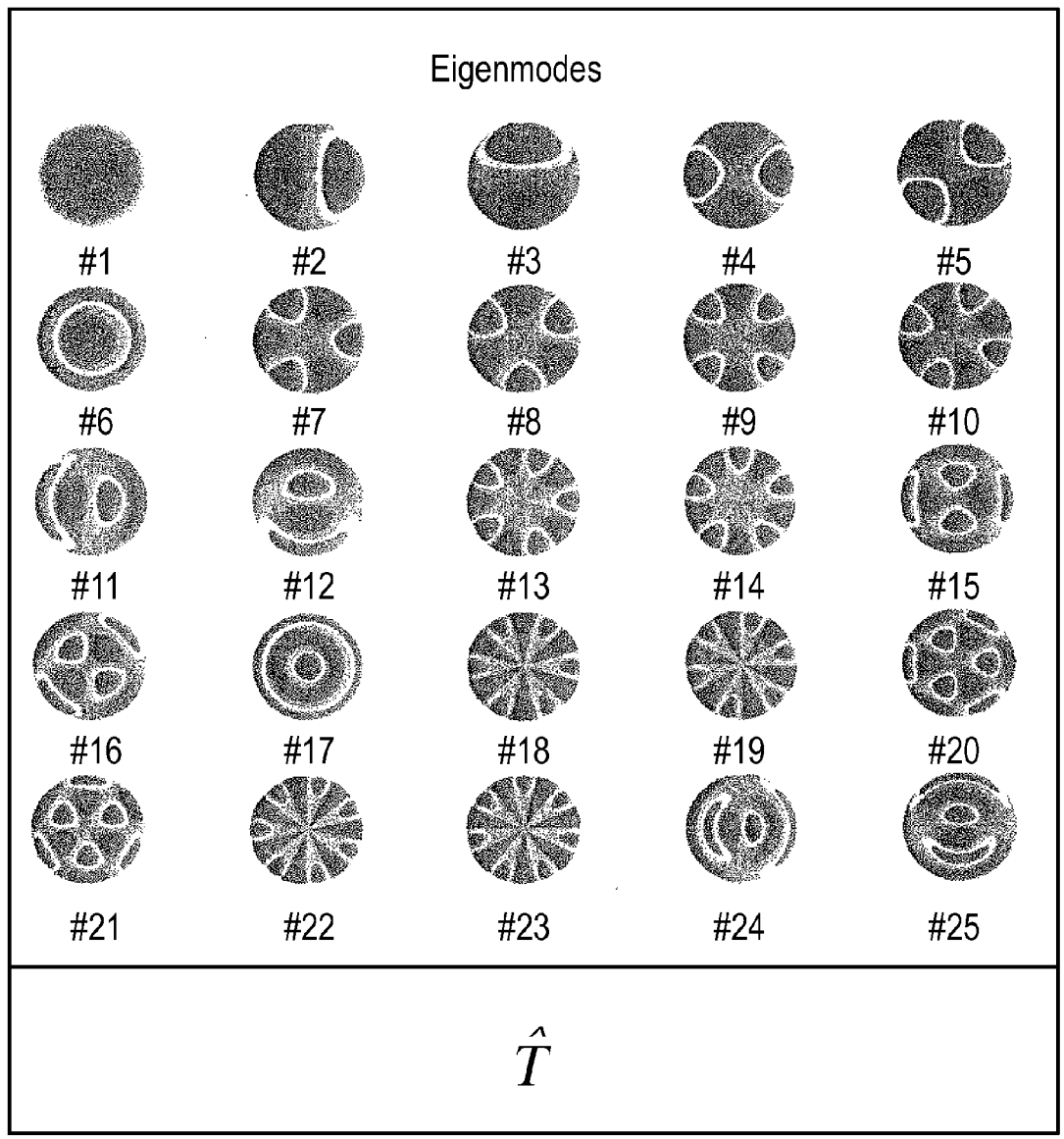
FIG. 5 illustrates exemplary eigenmodes obtained in calculating the heat transfer in the lens according to FIG. 4.

As already mentioned above $\hat{T}$ includes the eigenvectors, also referred to as eigenmodes or thermal modes, of the solution. FIG. 5 illustrates the eigenmodes 1 to 25 obtained by solving the eigenvalue problem (19) for an exemplary lens. Here it is noted that eigenmode #1, also referred to as the fundamental mode, displays a rotationally symmetric profile having its maximum in the center. Not all eigenmodes can be stimulated by boundary sources/sinks. In the example displayed in FIG. 5 only the eigenmodes #2, 3, 4, 5, 7, 8, 9, 10, 13, 14, 18, 19, 22 and 23 can be stimulated from the boundary. According to an embodiment the eigenmodes of the respective optical elements 30 of a projection objective 26 are determined in the factory and provided to the customer together with the projection objective 26 at delivery.

Figure 6:
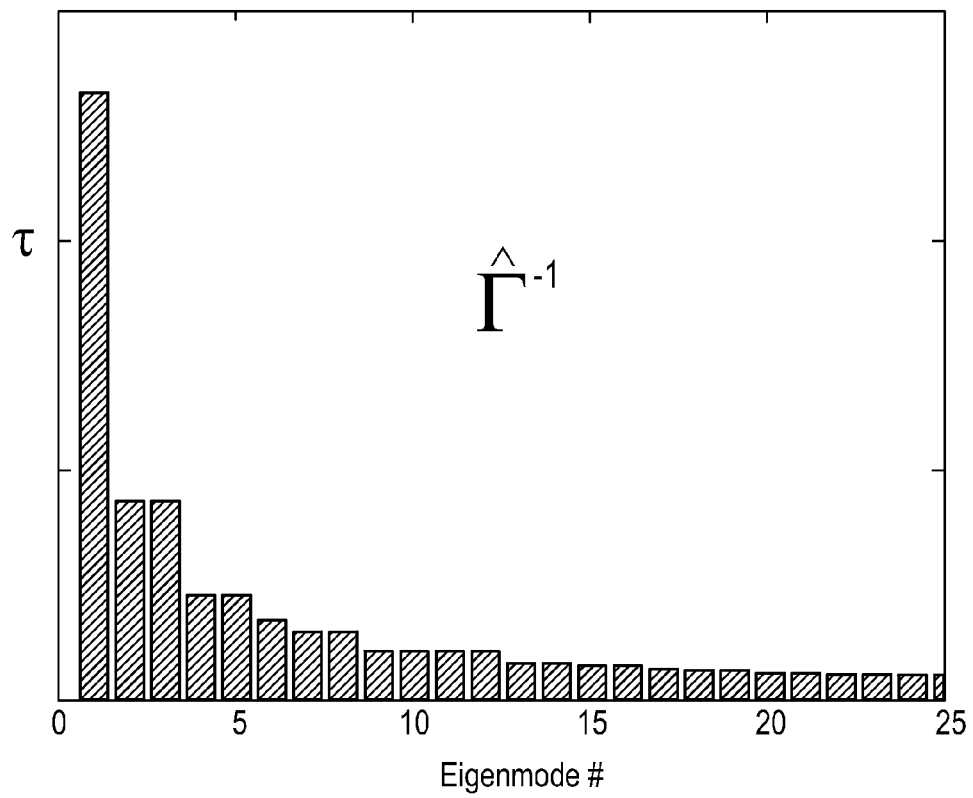
FIG. 6 illustrates exemplary eigenvalues corresponding to the eigenmodes of FIG. 5.

FIG. 6 displays the time constants $\tau$ contained in the diagonal matrix $\hat{\Gamma}^{-1}$ for the respective eigenmodes displayed in FIG. 5. After having determined $\hat{T}$ and $\hat{\Gamma}^{-1}$ for a given lens in the projection objective the temporal behavior of the temperature distribution in the lens can be easily obtained by calculating $\hat{\theta}$ from equation (32). For this only the vector $\hat{W}$ of the incoming heat distribution induced into the lens element 50 has to be provided. Equation (32) constitutes an analytical temperature distribution function of a single lens element of the projection objective used in the imaging process. The temperature distribution function contains the thermal eigenmodes $\hat{T}$. The incoming heat distribution $\hat{W}$ can e.g. be calculated separately for each mask used from the layout of the individual mask and the illumination mode used to expose the mask as described above.

Depending on the design of the projection objective 26 and the sensitivity to lens heating of the single lens elements contained therein the temperature distribution of several or all of the lens elements can be calculated using the above method. Therefore $\hat{T}$ and $\hat{\Gamma}^{-1}$ have to be determined for the respective lens elements to obtain $\hat{\theta}$ from equation (32) as a function of the respective incoming heat distribution $\hat{W}$, as detailed above. Before exposing a specific mask the incoming heat distribution $\hat{W}$ is determined for each of the lens elements included in the calculation. During the exposure of the mask the imaging behavior of the projection exposure tool is adjusted on the basis of a change of the optical properties of the lens elements derived from the calculated temperature distributions $\hat{\theta}$ in the lens elements as described above.

For this e.g. a wave front deviation or specific lithographic imaging errors resulting from the calculated temperature distributions $\hat{\theta}$ due to surface deformations and/or refractive index changes in the respective lens elements during the imaging process are calculated and necessary adjustments to the imaging behavior of the projection exposure tool 10 are determined, as mentioned above. In a further variation of manipulating the imaging behavior of the projection exposure tool 10 according to the invention the mounting of one or several lenses is heated and/or cooled in order influence the optical properties of the lenses accordingly. For this purpose a temperature distribution of the lens mounting suitable to generate the required change in the optical properties is calculated using the mathematical tools illustrated above.

The wave front deviation can be calculated by determining the respective Zernike coefficients. In this case each Zernike coefficient is a function of different thermal eigenmodes. Lower order eigenmodes are typically dominant. Thereafter an adjustment in the imaging behavior of the projection exposure tool 10 required to offset the calculated wave front deviation or the respective lithographic imaging errors is determined.

The Zernike coefficients referred to in this application relate to the polynomial development according to Zernike, in which Zernike-polynomials are used as polynomial basis. The polynomial development according to Zernike is known to the skilled person e.g. from chapter 13.2.3 of the text book "Optical shop testing", second edition (1992) published by John Wiley & Sons, Inc. and edited by Daniel Malacara. In this application the polynomial development according to Zernike of the wave front deviation $\Phi(\rho,\phi)$ is defined as follows:

$$\Phi(\rho, \varphi) = \sum_j c_j \cdot Z_j(\rho, \varphi), \quad (33)$$

wherein $\rho,\phi$ are polar coordinates in the pupil plane of the projection objective 26, $Z_j$ are the Zernike polynomials in the so-called fringe sorting and $c_j$ are the Zernike-coefficients associated to the respective Zernike polynomials. The fringe sorting of the Zernike polynomials is illustrated e.g. in table 20-2 on page 215 of "Handbook of Optical Systems", Vol. 2, edited by H. Gross, 2005 Wiley-VCH Verlag GmbH & Co. KGaA, Weinheim.

As mentioned above the target of the adjustments can be to obtain an as smooth as possible wave front. Thereby the absolute wave front errors and/or its gradients are to be minimized. This is generally done by performing a so-called Zernike optimization. Therein it is the target to minimize all Zernike coefficients of the determined wave front deviation equally. In an embodiment according to the invention the Zernike coefficients are weighted differently in the target function of the optimization problem depending on their importance to the lithographic application. For example the coefficient Z1, which is constant over the pupil can be meaningless for the image, therefore it can be weighted with 0% in the optimization problem.

In another embodiment according to the invention the adjustments are determined by weighting at least one location in the image plane, also referred to as field point, differently in the target function of the optimization problem as compared to other field points. Generally the wave front aberrations in form of their "Zernike decomposition" of all points in the image field are considered in the optimization.

According to the present embodiment of the invention the field points are weighted in the target function of the optimization problem according to their importance. In case of a projection exposure tool 10 in form of a step and scan system a whole line of image points of the projection objective 26 in scan direction of the exposure tool contributes in the imaging of one point on the mask 20. Thereby the respective contribution of the image points of the objective 26 differs in magnitude due to a non constant illumination distribution of the mask 20.

In this case several variations of weighting of the image points of the objective 26 in the correction are possible. According to one variation all image points of the objective 26 are weighted equally (conventional full field correction). According to another variation the image points of the objective 26 are weighted according to their contribution to the image (weighted full field correction). According to a further variation a weighted averaging of those wave fronts is performed, which contribute to the imaging of one point on the mask 20. The weighting is performed according to their contribution to the image. Subsequently the scanner averaged, one dimensional image field of the objective 26 is optimized (scanner integrated correction).

According to a further embodiment of the invention a first actuator and a second actuator of the adjustment device 46 are used for adjusting the imaging behavior of the projection exposure tool 10, wherein each of the actuators allow a first imaging error to be modified and the first actuator allows also a second imaging error to be modified. The response of the second imaging error, however, is smaller than the response of the first imaging error to a given manipulation of the first actuator. The actuators are only manipulated for minimizing the second imaging error in case the response of the second imaging error to the given manipulation of the first actuator is above a given threshold.

This way singular degrees of freedom are excluded from the optimization. Several beneficial effects can be obtained with this method. One beneficial effect is that the movements of the actuators are used economically, as it is ensured, that large movements are not used up for small improvements in the wave front. Further it is ensured that small improvements, which theoretically could be obtained by small differences of large effects, are not attempted as they would depend too much on the exact adjustment of the actuators.

The adjustment of the imaging behavior can be done before exposure of the mask. In this case the adjustment parameters are kept constant during the imaging process. As the temperature distributions $\theta$ are known as a function of time, the change in the optical properties of the lens elements are known at each point in time during the imaging process. The adjustment can therefore also be performed dynamically during the imaging process. The time constant of the lens heating and cooling is typically in the order of several minutes up to tens of minutes. It is therefore advantageous if the dynamic adjustment is performed over corresponding time frames, i.e. in particular over the time span required for the exposure of several fields on a wafer, the exposure of several wafers or even the exposure of several lots of wafers possibly using different masks.

As mentioned above, the adjustments can be performed in order to obtain an as smooth as possible wave front. According to another embodiment illustrated in the following the priority of the adjustment can be the reduction of one or several specific lithographic imaging errors.

According to this embodiment the layout of the mask 20 to be exposed is received by the input device 42 and subsequently analyzed by the processing device 44. Thereby at least one lithographic imaging error relevant to the lithographic image of the mask 20 is determined. An example of such a lithographic imaging error could be an astigmatism error causing orthogonally oriented object structures on the mask to be focused into different focal planes. Another example of such a lithographic imaging error could be a linear magnification error or a distortion error of third order being relevant to the lithographic image of the given mask layout.

After one or several relevant lithographic imaging errors have been identified for the given mask layout the imaging behavior of the projection objective 26 is adjusted using the adjustment device 46 to minimize the identified imaging errors. Thereby the minimization of these errors is given priority over a possible reduction of other imaging errors and in particular over the target of achieving an optimally smooth overall wave front in the image plane 28. The wave front deviation may even become less smooth than it would be without the adjustment. As a result of this also other lithographic imaging errors having an impact on the lithographic image and especially lithographic imaging errors having little impact for the given layout may be magnified as a result.

In the following an embodiment according to the invention is illustrated, in which the lithographic imaging error to be minimized is an imaging error causing orthogonally oriented object structures on the mask to be focused into different focal planes. Often predominant orientations of object structures on the mask 20 are parallel to the edges of a usually rectangular image field of the projection objective 26 (H- and V-structures). Often so called core structures having a particularly small pitch are oriented in a first direction (also referred to as primary structural direction or core), while so called periphery structures having a larger pitch are oriented perpendicularly (also referred to as secondary structural direction or periphery). In case of dipole illumination the orientation of the poles is related to the orientation of the core structures. For vertical core structures and horizontal periphery structures a x-dipole is used, while of horizontal core structures and vertical periphery structures a y-dipole is used.

For each structural direction a mean focal plane can be defined as the arithmetic average of the minimum and the maximum focus planes over all pitches used and all field points in the image plane 28. Due to the large depth of focus of the most critical object structures, for which the illumination setting, e.g. the orientation of the dipole, is adjusted particularly well, an area of pitches around the pitch of the most critical object structure can be ignored.

The best focal plane for all field points, pitches and orientations should be within a narrow range around the image plane 28 in order to ensure that all structures are within the depth of focus. One important metric to be optimized is therefore the so called H-V-difference being the difference of the average focal planes between horizontal and vertical structures. Another important metric is the best-focus shift of the core structures, being the maximum deviation of the focal plane of the core structures from the substrate plane over all pitches and field points. The best-focus shift of core+periphery structures is the maximum deviation of the focal plane of core and periphery structures over all pitches and field points from the substrate plane.

In case of a Zernike based correction the target of the optimization is to obtain wave fronts in the image plane being as smooth as possible. Therefore with such an optimization typically the H-V-difference is not zero, because not all wavefront aberrations inducing this H-V-difference can be corrected, typically higher order aberrations like Z12, Z21, Z32 (2-foil) or Z17, Z28 (4-foil). In contrast thereto according to the embodiment discussed presently the target of the optimization is to minimize the H-V difference.

Figure 7:
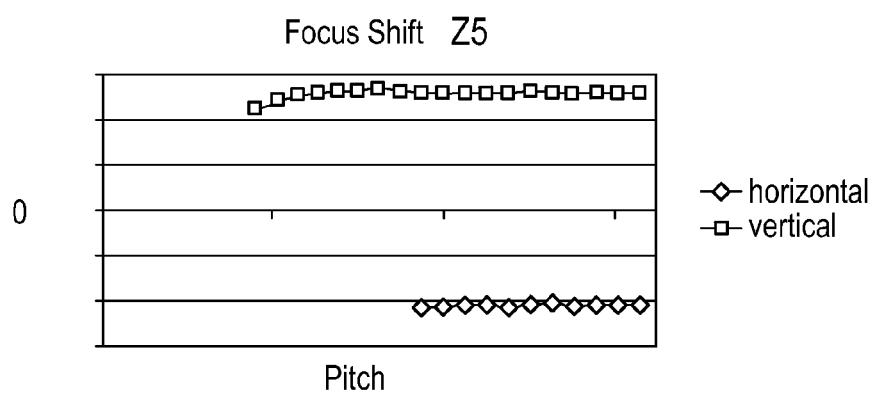
FIG. 7 depicts a simulation of the focus shift caused by a wave front deviation characterized by the Zernike polynomial Z5.

In one variation according to the invention the H-V focal difference is minimized by manipulating the coefficient of the Zernike polynomial Z5, as defined above, in the wave front deviation of the lithographic image. Generally the focus position of horizontal structures can be shifted with respect to the focus position of vertical structures by manipulating the coefficients of Zernike polynomials having an even azimutal waviness and mirror symmetry in horizontal and vertical direction, like e.g. Z5, Z9, Z12, Z16, Z17 etc. However it has been found that Z5 allows the H-V focal difference to be manipulated basically independent of the pitch of the structures. FIG. 7 depicts a simulation of the focus shift caused by a wave front deviation in Z5 with a given amplitude in case of dipole illumination. The simulation shows both for vertical and horizontal structures no significant variation of the focus shift with the pitch of the structures. The situation is similar for Z17. Therefore Z17 can be adjusted alternatively or additionally to Z5.

In order to manipulate a Z5 coefficient over the field the adjustment device 46 is advantageously equipped e.g. with Alvarez-manipulators. (Alvarez manipulators are optical elements configured to correct wavefront aberrations by laterally shifting optical elements with suitable strong aspheres or 2-dimensional manipulators to be used near the pupil of the projection objective 26. Further the projection objective 26 can be equipped with deformable lenses. In order to adjust a constant Z5 over the field a 2-foil deformable lens element close to the pupil of the projection objective is required.

Figure 8:
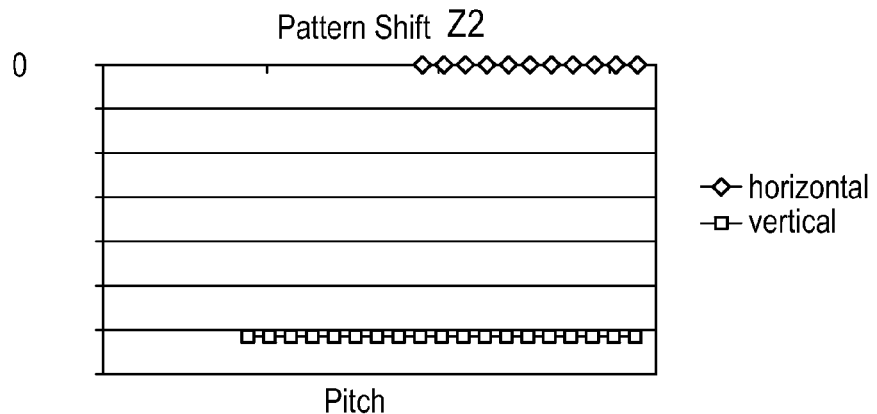
FIG. 8 depicts a simulation of the pattern shift caused by a wave front deviation characterized by the Zernike polynomial Z2.
Figure 9:
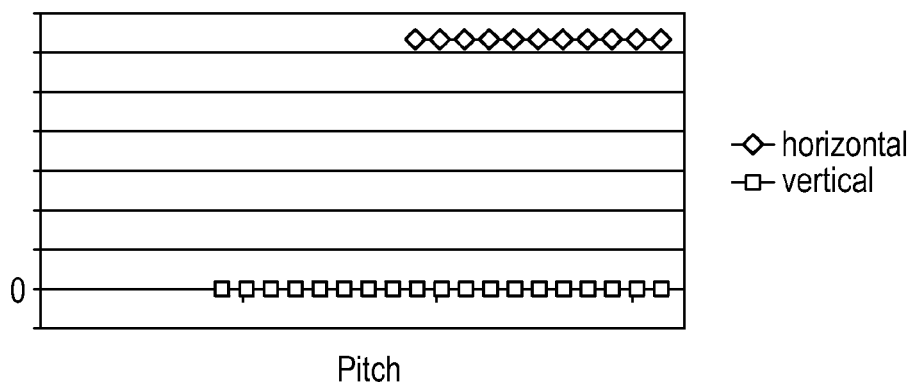
FIG. 9 depicts a simulation of the pattern shift caused by a wave front deviation characterized by the Zernike polynomial Z3.

In the following an embodiment according to the invention is illustrated, in which the lithographic imaging error to be minimized is an error causing the images of orthogonally oriented object structures to be shifted differently in the image plane. The magnitude of such a lateral pattern shift is typically dependent on the pitch of the structure and the field point. Generally such shifts are influenced by the coefficients of the uneven Zernike polynomials, which are not mirror symmetric with respect of the x- and y axes, like e.g. Z2, Z3, Z7, Z8, Z10, Z11 etc. However it has been found that Z2 and Z3 allows the lateral image shift of vertical and horizontal object structures to be manipulated independent of the pitch of the structures. FIGS. 8 and 9 show simulations of the pattern shift caused by a wave front deviation in Z2 and Z3, respectively. The simulations show both for vertical and horizontal structures no variation of the resulting pattern shift with the pitch of the structures.

For a certain structural direction the mean pattern shift can be defined as the arithmetic mean between the maximum and the minimum pattern shift over all pitches and field points. An overlay error can be defined as the maximum deviation of the pattern shifts over all pitches and field points from the mean pattern shift. The mean pattern shift can be compensated by lateral displacement of the substrate independently for horizontal and vertical structures. Therefore only the deviation from this mean value, i.e. the overlay error, is relevant for the lithographic image. In order to insure that object structures of all used sizes and at all locations on the mask are imaged at their target position on the substrate the overlay errors have to be as small as possible.

After correction of the average pattern shift a dependence from the pitch and the field point remains. The field dependence can be compensated partially: by defining the mean pattern shift for horizontal and vertical structures at one field point, $<dy>_{pitch}$ and $<dx>_{pitch}$ respectively, as the arithmetic mean between the maximum and the minimum pattern shift over all used pitches for the given structure orientation and the given field point the dependence of these parameters from the coordinates x, y of the field point can be described partly by a linear scale error "MAG" and a distortion of third order "D3":

As described above a pattern shift can be compensated pitch independently by the Z2 and Z3 portions in the wave front. The following applies:

$$\begin{pmatrix} dx \\ dy \end{pmatrix} = \frac{-1}{NA} \cdot \begin{pmatrix} Z_2 \\ Z_3 \end{pmatrix} \tag{33}$$

Put into a field point dependent form, (33) reads:

$$\begin{pmatrix} dx \\ dy \end{pmatrix}(x, y) = \frac{-1}{NA} \cdot \begin{pmatrix} Z_2 \\ Z_3 \end{pmatrix}(x, y), \tag{34}$$

wherein NA is the numerical aperture of the projection objective 26.

Via corresponding field characteristics of the Z2 and Z3 portions a magnification error (mag) and a distortion of third order ($d_3$) can be adjusted or compensated:

$$\begin{pmatrix} Z_2 \\ Z_3 \end{pmatrix}(x, y) = mag \cdot \begin{pmatrix} x \\ y \end{pmatrix} + d_3 \cdot (x^2 + y^2) \cdot \begin{pmatrix} x \\ y \end{pmatrix} \tag{35}$$

The coefficients of Z2/Z3 are related to dx/dy via NA, as shown above. The respective field characteristics of Z2/Z3 can be corrected well via a linear combination of manipulators having a radially symmetric effect (e.g. manipulating the wavelength of the electromagnetic radiation 13) or shifting of the substrate 24, the mask 20 or optical elements in direction of the optical axis 14.

With the tools described the constant portion of the wave front deviation over the field as well as the magnification error and the distortion of third order can be eliminated. A Zernike based correction is usually not sufficient for this purpose, as with a Zernike based correction the Zernike portions are reduced independently from each other and therefore the correction of pitch dependencies due to higher uneven Zernike errors cannot be accomplished via Z2 and Z3. Therefore it is advantageous if the MAG and D3 correction is implemented as an additional correction step e.g. after a MAG and D3 measurement or based on a model prediction.

In case the projection exposure tool 10 is configured as a step and scan exposure tool, also referred to as scanner, the pattern shifts averaged by the scan are to be corrected. In case the scan is performed in the y-direction the following terms result of the magnification terms (here MAG) and the distortion of third order terms (here $D_3$):

$$\overline{(dx)_{scan}}(x) = (MAG + D_3 \cdot \overline{y^2}) \cdot x + D_3 \cdot x^3 +$$

$$\overline{(dy)_{scan}}(x) = (MAG \cdot \overline{y} + D_3 \cdot \overline{y^3}) + D_3 \cdot \overline{y} \cdot x^2 + \tag{36}$$

The horizontal line represents the average over the radiation distribution in the scanner slot. Next to the radially symmetric portions of the distortion in general also anamorphotic terms appear, which can be corrected in part with manipulators close to the image plane 28 and have an azimuthal two-waviness (e.g. deformable lenses or Alvarez-manipulators).

When imaging a mask into the image plane 28 usually not all segments of the pupil of the projection objective 26 are used, as only certain structure sizes and orientations are present on the mask 20. The term "used segment of the pupil" in this context refers to the radiation rays associated to all points in the pupil plane, also referred to as aperture, of the projection objective 26 being irradiated during the exposure of a given mask 20. The "used segment of the pupil" therefore identifies the portions in the projection objective 26 traversed by the radiation 13 during the imaging process, also referred to as "region of interest" in the following. In a correction strategy according to the invention it is the target to minimize and smoothen only the wave front deformation relating to the actually used portion of the pupil. In the following this strategy is also referred to as "region of interest" correction.

In order to perform the region of interest correction the "region of interest", i.e. the radiation distribution within the pupil is determined first. The "region of interest" can e.g. be determined by a calculation of the diffraction spectrum of the mask, if all details of the mask, especially the layout of the mask, are known. In case the mask used is not known precisely enough the "region of interest" is determined by measurement. For this purpose e.g. the angular distribution of radiation arriving in the image plane 28 can be determined for one field point at a time with the mask of interest being inserted into the exposure tool 10. The "region of interest" is defined by those points in the pupil (or irradiation angles in the image plane 28), out of which for at least one field point a radiation level larger than a level caused by scattered light can be measured.

The present invention comprises the aspects of the following clauses which form part of the present description and are not claims:

Clause 1: A method of operating a projection exposure tool for microlithography having a projection objective for imaging object structures on a mask into an image plane using electromagnetic radiation, during which imaging the electromagnetic radiation causes a change in optical properties of the projection objective, which method comprises the steps of:
  providing the layout of the object structures on the mask to be imaged and classifying the object structures according to their type of structure,
  calculating the change in the optical properties of the projection objective effected during the imaging process on the basis of the classification of the object structures, and
  using the projection exposure tool for imaging the object structures into the image plane, wherein the imaging behavior of the projection exposure tool is adjusted on the basis of the calculated change of the optical properties in order to at least partly compensate for the change of the optical properties of the projection objective caused by the electromagnetic radiation during the imaging process.

Clause 2: The method according to clause 1, wherein the mask is illuminated during the imaging process with the electromagnetic radiation in a specific illumination mode, defining the angular distribution of the radiation illuminating the mask, and the calculation of the change in the optical properties is performed further on the basis of the illumination mode.

Clause 3: The method according to clause 1 or 2, wherein thermal eigenmodes of at least one single optical element of the projection objective are provided together with the projection objective and the calculation of the change in the optical properties is performed on the basis of the thermal eigenmodes.

Clause 4: The method according to any one of the preceding clauses, wherein the calculation of the change of the optical properties of the projection objective includes a calculation of an angular distribution of the electromagnetic radiation entering the projection objective for each of the classified types of structure.

Clause 5: The method according to any one of the preceding clauses, wherein the mask is illuminated during the imaging process with the electromagnetic radiation in one of several illumination modes and the angular distribution of the electromagnetic radiation entering the projection objective is calculated for each of the classified types of structure taking into account the illumination mode used during the imaging process.

Clause 6: The method according to any one of the preceding clauses, wherein the classification of the object structures includes a determination of the sizes of the respective areas covered by the different types of structures on the mask.

Clause 7: The method according to clause 6, wherein the calculation of the change of the optical properties of the projection objective includes a determination of an approximated overall angular distribution of the electromagnetic radiation entering the projection objective, which overall angular distribution is calculated from a weighted sum of the angular distributions for the single classified types of structures, which angular distributions are respectively weighted by the determined sizes of the mask areas covered by the respective types of structures.

Clause 8: The method according to any one of the preceding clauses, wherein the classification of the object structures contains a portioning of the mask into at least two types of regions, wherein a first type of region contains densely arranged object structures with respect to a second type of region, which contains sparsely arranged object structures with respect to the first type of region.

Clause 9: The method according to clause 8, wherein in the calculation of the change in the optical properties of the projection objective the region of the second type is approximated by a region containing no object structures.

Clause 10: The method according to any one of the preceding clauses, wherein the calculated change in optical properties of the projection objective during the imaging process is due to heating of at least one single optical element of the projection objective caused by the electromagnetic radiation irradiating the respective lens.

Clause 11: The method according to any one of the preceding clauses, wherein a deviation of the wave front in the image plane due to the change in the optical properties is calculated and the imaging behavior of the projection exposure tool is adjusted in order to compensate for the calculated wave front deviation.

Clause 12: The method according to any one of the preceding clauses, wherein the imaging behavior of the projection exposure tool is adjusted by manipulating the position or shape of at least one optical element using an actuator.

Clause 13: The method according to clause 12, wherein the adjustment of the imaging behavior is performed by optimizing the coefficients of the Zernike polynomials of the wave front deviation of the lithographic image, at least one of the coefficients of the Zernike polynomials being weighted differently in the target function of the optimization problem as compared to other coefficients.

Clause 14: The method according to clause 12 or 13, wherein the adjustment of the imaging behavior is performed by optimizing the coefficients of the Zernike polynomials of the wave front deviation of the lithographic image, at least one location in the image plane being weighted differently in the target function of the optimization problem as compared the coefficients at other locations in the image plane.

Clause 15: The method according to any one of clauses 12 to 14,
wherein the adjustment of the imaging behavior is performed by reducing the wave front deformation in the image plane only for radiation components traversing the projection objective in selected pupil segments.

Clause 16: The method according to any one of clauses 12 to 15,
wherein a first actuator and a second actuator are used for adjusting the imaging behavior of the projection exposure tool, each of the actuators allowing a first imaging error to be modified and the first actuator allowing also a second imaging error to be modified, the response of the second imaging error being smaller than the response of the first imaging error to a given manipulation of the first actuator, and the actuators are only manipulated for minimizing the second imaging error in case the response of the second imaging error to the given manipulation of the first actuator is above a given threshold.

Clause 17: The method according to any one of the preceding clauses,
wherein at least one lithographic imaging error having an impact on the lithographic image for the given layout is determined, the imaging behavior of the projection objective is adjusted in order to correct the change in the optical properties of the projection objective caused by the electromagnetic radiation such that the at least one lithographic imaging error is reduced, wherein the reduction of the lithographic imaging error has a higher priority than a smoothing of the overall wave front deviation of the lithographic image.

Clause 18: The method according to any one of the preceding clauses,
wherein the imaging behavior of the projection exposure tool is adjusted before performing the imaging of the object structures and/or dynamically during the imaging process.

Clause 19: The method according to any one of the preceding clauses,
wherein during the imaging the electromagnetic radiation causes a change in optical properties of at least one single optical element of the projection objective, a heat distribution induced into the optical element by the electromagnetic radiation during the imaging process is determined, a resulting temperature distribution in the optical element is calculated from the determined induced heat distribution via a temperature distribution function, which temperature distribution function is an analytical function of the heat distribution and contains thermal eigenmodes of the optical element, and object structures are imaged into the image plane, wherein the imaging behavior of the projection exposure tool is adjusted on the basis of a change of the optical properties of the optical element derived from the calculated temperature distribution.

Clause 20: A method of operating a projection exposure tool for microlithography having a projection objective for imaging object structures on a mask into an image plane using electromagnetic radiation, during which imaging the electromagnetic radiation causes a change in optical properties of at least one single optical element of the projection objective, which method comprises the steps of:
 determining a heat distribution induced into the optical element by the electromagnetic radiation during the imaging process,
 calculating a resulting temperature distribution in the optical element from the determined induced heat distribution via a temperature distribution function, which temperature distribution function is an analytical function of the heat distribution and contains thermal eigenmodes of the optical element, and
 imaging the object structures into the image plane, wherein the imaging behavior of the projection exposure tool is adjusted on the basis of a change of the optical properties of the optical element derived from the calculated temperature distribution in order to at least partly compensate for the change of the optical properties of the optical element caused by the electromagnetic radiation during the imaging process.

Clause 21: The method according to clause 20,
wherein the temperature distribution function of the optical element is provided as a function of time.

Clause 22: The method according to clause 20 or 21,
wherein the temperature distribution function is provided by solving a heat transport equation of the optical element via an eigenvalue and eigenmode analysis.

Clause 23: The method according to clause 22,
wherein in the heat transport equation of the optical element the temperature is considered to be constant in direction of the optical axis of the optical element.

Clause 24: The method according to any one of clauses 20 to 23,
wherein a layout of the object structures on the mask, and in particular an illumination mode, defining the angular distribution of the radiation illuminating the mask during the imaging process, is provided and the heat distribution induced into the optical element is determined from the layout of the object structures, and in particular the illumination mode.

Clause 25: The method according to clause 24,
wherein the layout of the object structures is used for classifying the object structures according to their type of structure and their location on the mask and the heat distribution induced into the optical element is calculated on the basis of the classification of the object structures.

Clause 26: The method according to any one of clauses 20 to 25,
wherein the layout of the object structures on the mask to be imaged, and in particular the illumination mode, is provided and the object structures are classified according to their type of structure, the change in the optical properties of the projection objective during the imaging process is calculated on the basis of the classification of the object structures, and the imaging behavior of the projection exposure tool is adjusted on the basis of the calculated change of the optical properties in order to at least partly compensate for the change of the optical properties of the projection objective caused by the electromagnetic radiation during the imaging process.

Clause 27: The method according to any one of clauses 20 to 26,
wherein a respective temperature distribution is calculated for several optical elements of the projection objective and the imaging behavior of the projection exposure tool is adjusted on the basis of a change of the optical properties of the respective optical elements derived from the calculated temperature distributions.

Clause 28: The method according to any one of clauses 20 to 27,
a layout of the object structures on the mask to be imaged is provided and at least one lithographic imaging error having an impact on the lithographic image for the given layout is determined, and the imaging behavior of the projection objective is adjusted for correcting the change in the optical properties of the projection objective caused by the electromagnetic radiation such that the at least one lithographic imaging error is reduced, wherein the adjustment of the imaging behavior of the projection objective is performed such that the reduction of the lithographic imaging error is effected thereby with a higher priority than a smoothing of the overall wave front deviation of the lithographic image.

Clause 29: A method of operating a projection exposure tool for microlithography having a projection objective for imaging object structures on a mask into an image plane using electromagnetic radiation, during which imaging the electromagnetic radiation causes a change in optical properties of the projection objective, which method comprises the steps of:
- providing a layout of the object structures on the mask to be imaged and determining at least one lithographic imaging error having an impact on the lithographic image for the given layout, and
- imaging the object structures into the image plane, wherein the imaging behavior of the projection objective is adjusted for correcting the change in the optical properties of the projection objective caused by the electromagnetic radiation such that the at least one lithographic imaging error is reduced, wherein the adjustment of the imaging behavior of the projection objective is performed such that the reduction of the lithographic imaging error is effected thereby with a higher priority than a smoothing of the overall wave front deviation of the lithographic image.

Clause 30: The method according to clause 29, wherein the at least one imaging error is reduced selectively regardless of at least one other imaging error having an impact on the lithographic image for the given layout being magnified as a result of the adjustment.

Clause 31: The method according to clause 30, wherein the lithographic imaging error being reduced has a larger impact on the lithographic image for the given layout than the lithographic imaging error being magnified as a result of the adjustment.

Clause 32: The method according to any one of clauses 29 to 31, wherein a subgroup of lithographic imaging errors is determined, which subgroup contains the most relevant lithographic imaging errors with respect of the given layout of the object structures in that these imaging errors have the largest impact on the lithographic image for the given layout, and the imaging behavior of the projection objective is adjusted in order to correct the change in the optical properties of the projection objective caused by the electromagnetic radiation such that at least one imaging error of the subgroup of lithographic imaging errors is reduced selectively regardless of imaging errors not contained in the subgroup being magnified as a result of the adjustment.

Clause 33: The method according to any one of clauses 29 to 32, wherein the imaging behavior of the projection objective is adjusted such that the extent of the reduction of the imaging error achieved thereby is basically independent of the pitch of object structures, regarding which the imaging error is relevant in that the image of these object structures is affected by the imaging error.

Clause 34: The method according to any one of clauses 29 to 33, wherein the imaging error being reduced causes orthogonally oriented object structures to be focused into different average focus planes.

Clause 35: The method according to clause 34, wherein the imaging behavior of the projection objective is adjusted by adjusting the coefficient of the Zernike polynomial $Z5$ and/or $Z6$ in the wave front deviation of the lithographic image such that the distance between resulting average focus planes of orthogonally oriented object structures is minimized.

Clause 36: The method according to any one of clauses 29 to 35, wherein the imaging error being reduced includes a linear magnification error and/or a distortion error of third order of the projection objective.

Clause 37: The method according to any one of clauses 29 to 36, wherein the imaging error minimized causes the images of orthogonally oriented object structures to be shifted differently in the image plane.

Clause 38: The method according to clause 37, wherein the imaging behavior of the projection objective is adjusted by adjusting the coefficient of the Zernike polynomial $Z2$ and/or $Z3$ in the wave front deviation of the lithographic image such that the pitch averaged magnification, third order distortion and a/or constant lateral shift of structures are minimized.

Clause 39: The method according to any one of clauses 29 to 38, wherein the object structures are classified according to their type of structure, the change in the optical properties of the projection objective during the imaging process is calculated approximately on the basis of the classification of the object structures, and the imaging behavior of the projection exposure tool is adjusted on the basis of the calculated change of the optical properties in order to at least partly compensate for the change of the optical properties of the projection objective caused by the electromagnetic radiation during the imaging process.

Clause 40: The method according to any one of clauses 29 to 39, wherein during the imaging the electromagnetic radiation causes a change in optical properties of at least one single optical element of the projection objective, a temperature distribution function of the single optical element is provided, which temperature distribution function is an analytical function of an incoming heat distribution absorbed by the optical element and contains thermal eigenmodes of the optical element, a heat distribution induced into the optical element by the electromagnetic radiation during the imaging process is determined, the resulting temperature distribution in the optical element is calculated from the determined induced heat distribution via the temperature distribution function, and the object structures are imaged into the image plane, wherein the imaging behavior of the projection exposure tool is adjusted on the basis of a change of the optical properties of the optical element derived from the calculated temperature distribution.

Clause 41: A control apparatus for operating a projection exposure tool for microlithography having a projection objective for imaging object structures on a mask into an image plane using electromagnetic radiation, during which imaging the electromagnetic radiation causes a change in optical properties of the projection objective, the control apparatus comprising:
- an input device for receiving the layout of the object structures on the mask to be imaged,
- a processing device configured to classify the object structures according to their type of structure and to calculate the change in the optical properties of the projection objective effected during the imaging process approximately on the basis of the classification of the object structures, and an adjustment device configured to adjust the imaging behavior of the projection exposure tool on the basis of the calculated change of the optical properties in order to at least partly compensate for the change of the optical properties of the projection objective caused by the electromagnetic radiation during the imaging process.

Clause 42: A control apparatus for operating a projection exposure tool for microlithography having a projection objective for imaging object structures on a mask into an image plane using electromagnetic radiation, during which imaging the electromagnetic radiation causes a change in optical properties of at least one single optical element of the projection objective, the control apparatus comprising:
 a processing device configured to calculate a resulting temperature distribution in the single optical element from a heat distribution induced into the optical element by the electromagnetic radiation during the imaging process, wherein the resulting temperature distribution is calculated via a temperature distribution function of the single optical element, which temperature distribution function is an analytical function of the heat distribution and contains thermal eigenmodes of the optical element, and
 an adjustment device configured to adjust the imaging behavior of the projection exposure tool on the basis of a change of the optical properties of the optical element derived from the calculated temperature distribution in order to at least partly compensate for the change of the optical properties of the optical element caused by the electromagnetic radiation during the imaging process.

Clause 43: A control apparatus for operating a projection exposure tool for microlithography having a projection objective for imaging object structures on a mask into an image plane using electromagnetic radiation, during which imaging the electromagnetic radiation causes a change in optical properties of the projection objective, the control apparatus comprising:
 an input device for receiving the layout of the object structures on the mask to be imaged,
 a processing device configured to determine at least one lithographic imaging error having an impact on the lithographic image for the given layout and to calculate an adjustment setting for correcting the change in the optical properties of the projection objective caused by the electromagnetic radiation such that the at least one lithographic imaging error is reduced, wherein the reduction of the lithographic imaging error is effected thereby with a higher priority than a smoothing of the overall wave front deviation of the lithographic image, and
 an adjustment device configured to adjust the imaging behavior of the projection objective according to the calculated adjustment setting.

Clause 44: The control apparatus according to any one of clauses 41 to 43, which is configured to perform the method according to any one of clauses 1 to 40.

Clause 45: A projection exposure tool for microlithography comprising the control apparatus according to any one of clauses 41 to 44.

The present invention has been described by way of exemplary embodiments to which it is not limited. Variations and modifications will occur to those skilled in the art without departing from the scope of the present invention as recited in the appended claims and equivalents thereof.

LIST OF REFERENCE SIGNS 10 projection exposure tool
12 radiation source
13 electromagnetic radiation
13a electromagnetic radiation
13b electromagnetic radiation
14 optical axis
16 illumination system
18 optical element
20 mask
22 object plane
24 substrate
26 projection objective
28 image plane
30 optical element
31 full chip
32 cell area
34 periphery
40 control apparatus
42 input device
44 processing device
46 adjustment device
50 lens element
52 optical axis
54 lens surface

The invention claimed is:

1. A method of operating a microlithography projection exposure tool comprising a projection objective, the projection objective being configured to use electromagnetic radiation to image object structures on a mask into an image plane, the method comprising:
 calculating a change in optical properties of the projection objective caused by the electromagnetic radiation during an imaging process, the calculation of the change in optical properties being done on the basis of a Fourier transform of a layout of the mask; and
 adjusting the imaging behavior of the projection exposure tool on the basis of the calculated change of the optical properties to at least partly compensate for the change of the optical properties of the projection objective,
 wherein calculating the change in the optical properties is performed on the basis of thermal eigenmodes of at least one single optical element of the projection objective.

2. The method of claim 1, comprising classifying the object structures on the basis of their type of structure.

3. The method of claim 2, wherein calculating the change of the optical properties of the projection objective comprises calculating an angular distribution of the electromagnetic radiation entering the projection objective for each of the classified types of structure.

4. The method of claim 2, wherein classifying the object structures comprises determining sizes of respective areas covered by the different types of structures on the mask.

5. The method of claim 1, comprising:
 during the imaging process, illuminating the mask with the electromagnetic radiation in a specific illumination mode;
 defining an angular distribution of the electromagnetic radiation illuminating the mask during the imaging process; and
 calculating the change in the optical properties on the basis of the illumination mode.

6. The method of claim 1, wherein performing the Fourier transform comprises classifying the object structures, the classification comprising portioning of the mask into at least first and second regions, wherein the object structures in the first region are more densely arranged than the object structures in the second region.

7. The method of claim 1, comprising:
calculating a deviation of the wave front in the image plane due to the change in the optical properties; and
adjusting the imaging behavior of the projection exposure tool to compensate for the calculated wave front deviation.

8. The method of claim 1, comprising adjusting the imaging behavior of the projection objective to correct the change in the optical properties of the projection objective caused by the electromagnetic radiation to reduce at least one lithographic imaging error having an impact on the lithographic image for the layout, wherein the reduction of the lithographic imaging error has a higher priority than a smoothing of the overall wave front deviation of the lithographic image.

9. The method of claim 1, wherein the Fourier transform of the layer is convolved with an angular distribution of the electromagnetic radiation illuminating the mask during the imaging process.

10. The method of claim 9, wherein the convolution yields a parameter related to an effective pupil.

11. The method of claim 10, wherein the parameter is a distribution of diffraction angles of radiation entering the projection objective for each of a plurality of classified types of object structures.

12. The method of claim 1, wherein the change of the optical properties of the projection objective is caused by heating.

13. The method of claim 12, wherein effects caused by heating are corrected dynamically.

14. The method of claim 12, wherein the projection objective comprises a plurality of lenses and the heating is lens heating.

15. The method of claim 14, wherein the calculation takes into account a distribution of diffraction angle of radiation diffracted from the mask.

16. The method of claim 14, wherein the calculation of the change in optical properties is based on an angular distribution of electromagnetic radiation at the mask and the Fourier transform of the mask.

17. The method of claim 16, wherein the imaging behavior of the projection exposure tool is adjusted by manipulating a position of at least one optical element in the projection objective.

18. The method of claim 17, wherein the manipulation comprises moving a lens along an optical axis of the projection objective.

19. The method of claim 17, wherein the manipulation comprises turning a lens with respect to an optical axis of the projection objective or deforming the at least one optical element.

20. A method of operating a microlithography projection exposure tool comprising a projection objective, the projection objective being configured to use electromagnetic radiation to image object structures on a mask into an image plane, the method comprising:
determining at least one lithographic imaging error that will have an impact on the lithographic image for a given layout of the object structures on the mask;
imaging the object structures into the image plane; and
adjusting the imaging behavior of the projection objective to correct a change in the optical properties of the projection objective caused by the electromagnetic radiation so that the at least one lithographic imaging error is reduced with a higher priority than a smoothing of the overall wave front deviation of the lithographic image, wherein the smoothing is targeted to segments of a pupil of the projection objective that are traversed by the electromagnetic radiation during the imaging,
wherein calculating the change in the optical properties is performed on the basis of thermal eigenmodes of at least one single optical element of the projection objective.

21. The method of claim 20, comprising classifying the object structures on the basis of their type of structure.

22. The method of claim 21, wherein calculating the change of the optical properties of the projection objective comprises calculating an angular distribution of the electromagnetic radiation entering the projection objective for each of the classified types of structure.

23. The method of claim 21, wherein classifying the object structures comprises determining sizes of respective areas covered by the different types of structures on the mask.

24. The method of claim 21, wherein classifying the object structures comprises portioning of the mask into at least first and second regions, wherein the object structures in the first region are more densely arranged than the object structures in the second region.

25. The method of claim 20, comprising:
during the imaging process, illuminating the mask with the electromagnetic radiation in a specific illumination mode;
defining an angular distribution of the electromagnetic radiation illuminating the mask during the imaging process; and
calculating the change in the optical properties on the basis of the illumination mode.

26. The method of claim 20, comprising:
calculating a deviation of the wave front in the image plane due to the change in the optical properties; and
adjusting the imaging behavior of the projection exposure tool to compensate for the calculated wave front deviation.

27. An apparatus, comprising:
an input device configured to receive a layout of object structures on a mask to be imaged by a projection objective of a microlithography projection exposure tool;
a processing device configured to: compute a Fourier transform of the layout; and calculate a change in optical properties of the projection objective effected during an imaging process approximately on the basis of the Fourier transform and on the basis of thermal eigenmodes of at least one single optical element of the projection objective, the imaging process comprising using electromagnetic radiation to image the object structures into an image plane; and
an adjustment device configured to adjust an imaging behavior of the projection exposure tool on the basis of the calculated change of the optical properties to at least partly compensate for the change of the optical properties of the projection objective caused by the electromagnetic radiation during the imaging process.

28. A tool, comprising:
a projection objective; and
a control apparatus according to claim 27,
wherein the tool is a microlithography projection exposure tool.

29. The tool of claim 28, further comprising an illumination system.

30. The apparatus of claim 27, wherein the processing device is configured to classify the object structures of the mask according to their type of structure and to determine an effective pupil for each of the types of object structures by convolving a Fourier transform of the object structures with an angular distribution of illumination radiation.

31. A system comprising the apparatus of claim 27, the system comprising a microlithography projection exposure tool comprising the adjustment device.

32. The system of claim 31, wherein the projection objective of the microlithography projection exposure tool comprises a plurality of optical elements configured to image the object structures to the image plane using electromagnetic radiation, and the processing device is configured to calculate a change in the optical properties of the projection objective due to heating of one or more of the optical elements during the imaging process.

33. The system of claim 32, wherein the adjustment device comprises a manipulator configured to manipulate at least one optical element in the projection objective.

34. The system of claim 33, wherein the manipulation is a position of the optical element along an optical axis of the projection objective.

35. The system of claim 33, wherein the manipulation is a rotation of the optical element with respect to an optical axis of the projection objective or a deformation of the optical element.

36. The system of claim 33, wherein the processing device is further configured to classify the object structures by identifying different areas of the mask according to types of structures in each of the different areas.

* * * * *

UNITED STATES PATENT AND TRADEMARK OFFICE
CERTIFICATE OF CORRECTION

PATENT NO. : 9,442,381 B2
APPLICATION NO. : 13/939859
DATED : September 13, 2016
INVENTOR(S) : Olaf Conradi et al.

It is certified that error appears in the above-identified patent and that said Letters Patent is hereby corrected as shown below:

In the Specification

Column 1
Lines 3-5, below "MICROLITHOGRAPHY" insert -- Cross-Reference to Related Applications
The present application is a continuation of, and claims benefit under 35 USC 120 to, international application PCT/EP2011/000225, filed Jan. 20, 2011. The entire disclosure of international application PCT/EP2011/000225 is incorporated by reference herein. --

Line 35, delete "fininte" and insert -- finite --

Line 45, delete "particularcontain" and insert -- particular contain --

Column 10
Line 50, delete "(and/or)45°-135°" and insert -- (and/or 45°-135°) --

Column 14
Line 15, delete ""peripery"" and insert -- "periphery" --

Column 16
Line 57, delete "pp" and insert -- φ --

Column 17
Line 59 (Approx.), delete "$\theta (t, \rho, \phi) = \theta_t (t) \theta_{\rho,\phi}(\rho, \phi)$"
and insert -- $\vartheta (t, \rho, \varphi) = \vartheta_t (t) \vartheta_{\rho,\varphi}(\rho, \varphi)$ --

Column 18
Line 25, delete "$\theta_{\rho,\phi} (\rho, \phi) = \theta_\rho (\rho) \theta_\phi(\phi)$"
and insert -- $\vartheta_{\rho,\varphi} (\rho, \varphi) = \vartheta_\rho (\rho) \vartheta_\varphi(\varphi)$ --

Signed and Sealed this
Twenty-eighth Day of March, 2017

Michelle K. Lee
*Director of the United States Patent and Trademark Office*

CERTIFICATE OF CORRECTION (continued)
U.S. Pat. No. 9,442,381 B2

Line 41 (Approx.), delete "$\theta_\phi(\phi) = A\cos(m\phi) + B\sin(m\phi)$"
and insert -- $\vartheta_\varphi(\varphi) = A\cos(m\varphi) + B\sin(m\varphi)$ --

Column 19
Line 31, delete "$d^2\vartheta d^2\rho$" and insert -- $d^2\vartheta/d^2\rho$ --

Line 56, delete " $\hat{\theta}_\rho$ " and insert -- $\hat{\vartheta}_\rho$ --

Line 62 (Approx.), delete " $\hat{Q}\hat{\theta}^i_\rho = \Gamma_i \hat{\theta}^i_\rho$ " and insert -- $\hat{Q}\hat{\vartheta}^i_\rho = \Gamma_i \hat{\vartheta}^i_\rho$ --

Line 63, delete " $\hat{\theta}^i_\rho$ " and insert -- $\hat{\vartheta}^i_\rho$ --

Column 20
Line 15, delete " $\hat{\theta}^i_\rho$ " and insert -- $\hat{\vartheta}^i_\rho$ --

Line 21 (Approx.), delete " $\hat{\theta} = \hat{T}\hat{\bar{\theta}}$ " and insert -- $\hat{\vartheta} = \hat{T}\hat{\bar{\vartheta}}$ --

Line 22, delete " $\hat{\bar{\theta}}$ " and insert -- $\hat{\bar{\vartheta}}$ --

Line 36-37, delete " $T\dfrac{\partial \hat{\bar{\vartheta}}}{\partial t} - \hat{T}\hat{\Gamma}\hat{T}^{-1}\hat{T}\hat{\bar{\vartheta}} = \hat{T}\hat{\bar{W}}(\rho,\varphi)$ "

and insert -- $\hat{T}\dfrac{\partial \hat{\bar{\vartheta}}}{\partial t} - \hat{T}\hat{\Gamma}\hat{T}^{-1}\hat{T}\hat{\bar{\vartheta}} = \hat{T}\hat{\bar{W}}(\rho,\varphi)$ --

Line 49, delete " $\hat{\bar{\theta}} = A\exp(\hat{\Gamma}t) - \hat{\Gamma}^{-1}\overline{W}(\rho,\phi)$ "

and insert -- $\hat{\bar{\vartheta}} = A\exp(\hat{\Gamma}t) - \hat{\Gamma}^{-1}\hat{\overline{W}}(\rho,\varphi)$ --

Line 53 (Approx.), delete " $\hat{\bar{\theta}}(0) = \hat{\bar{\theta}}_0 = A - \hat{\Gamma}^{-1}\overline{W}(\rho,\phi)$ "

and insert -- $\hat{\bar{\vartheta}}(0) = \hat{\bar{\vartheta}}_0 = A - \hat{\Gamma}^{-1}\hat{\overline{W}}(\rho,\varphi)$ --

CERTIFICATE OF CORRECTION (continued)
U.S. Pat. No. 9,442,381 B2

Column 20 Cont.

Line 55, delete "$\rightarrow A = \hat{\bar{\theta}}_0 + \hat{\Gamma}^{-1}\overline{\hat{W}}(\rho,\phi)$"

and insert -- $\rightarrow A = \hat{\bar{\vartheta}}_0 + \hat{\Gamma}^{-1}\overline{\hat{W}}(\rho,\varphi)$ --

Line 59, delete "$\hat{\bar{\theta}} = \exp(\hat{\Gamma}t)\left(\hat{\bar{\theta}} + \hat{\Gamma}^{-1}\overline{\hat{W}}(\rho,\phi)\right) - \hat{\Gamma}^{-1}\overline{\hat{W}}(\rho,\phi)$"

and insert -- $\hat{\bar{\vartheta}} = \exp(\hat{\Gamma}t)\left(\hat{\bar{\vartheta}} + \hat{\Gamma}^{-1}\overline{\hat{W}}(\rho,\varphi)\right) - \hat{\Gamma}^{-1}\overline{\hat{W}}(\rho,\varphi)$ --

Line 62 (Approx.), delete "$\hat{\theta} = \hat{T}\hat{\bar{\theta}} \quad \hat{W} = \hat{T}\overline{\hat{W}}$"

and insert -- $\hat{\vartheta} = \hat{T}\hat{\bar{\vartheta}} \quad \hat{W} = \hat{T}\overline{\hat{W}}$ --

Line 66 (Approx.), delete "
$\hat{\theta} = \hat{T}\exp(\hat{\Gamma}t)\hat{T}^{-1}\left(\hat{\theta}(0) + \hat{T}\hat{\Gamma}^{-1}\hat{T}^{-1}\hat{W}\right) -$
$- \hat{T}\hat{\Gamma}^{-1}\hat{T}^{-1}\hat{W}$
"

and insert --
$\hat{\vartheta} = \hat{T}\exp(\hat{\Gamma}t)\hat{T}^{-1}\left(\hat{\vartheta}(0) + \hat{T}\hat{\Gamma}^{-1}\hat{T}^{-1}\hat{W}\right) -$
$- \hat{T}\hat{\Gamma}^{-1}\hat{T}^{-1}\hat{W}$
--

Column 21

Line 1, delete "$\hat{\theta}$" and insert -- $\hat{\vartheta}$ --

Line 25, delete "$\hat{\theta}$" and insert -- $\hat{\vartheta}$ --

Line 40, delete "$\hat{\theta}$" and insert -- $\hat{\vartheta}$ --

Line 48, delete "$\hat{\theta}$" and insert -- $\hat{\vartheta}$ --

Line 52, delete "$\hat{\theta}$" and insert -- $\hat{\vartheta}$ --

Column 23

Line 31, delete "$\hat{\theta}$" and insert -- $\hat{\vartheta}$ --

Column 24
Line 62, delete "azimutal" and insert -- azimuthal --

CERTIFICATE OF CORRECTION (continued)
U.S. Pat. No. 9,442,381 B2

Line 64 (Approx.), delete "(33)" and insert -- (34) --

Column 26
Line 1, delete "(33)" and insert -- (34) --

Line 4 (Approx.), delete "(34)" and insert -- (35) --

Line 15, delete "(35)" and insert -- (36) --

Line 47 (Approx.), delete "(36)" and insert -- (37) --